(12) United States Patent
Axelrod et al.

(10) Patent No.: US 7,205,860 B2
(45) Date of Patent: Apr. 17, 2007

(54) ELECTROMAGNETIC INTERFACE MODULE FOR BALANCED DATA COMMUNICATION

(75) Inventors: Alexander M. Axelrod, Moshav Hanniel (IL); Zeev Shpiro, Tel-Aviv (IL)

(73) Assignee: Advanced Magnetic Solutions Limited, Wanchai (HK)

(*) Notice: Subject to any disclaimer, the term of this patent is extended or adjusted under 35 U.S.C. 154(b) by 0 days.

(21) Appl. No.: 11/007,610

(22) Filed: Dec. 8, 2004

(65) Prior Publication Data

US 2005/0168298 A1     Aug. 4, 2005

Related U.S. Application Data

(60) Provisional application No. 60/614,259, filed on Sep. 30, 2004, provisional application No. 60/581,007, filed on Jun. 9, 2004, provisional application No. 60/528,861, filed on Dec. 9, 2003.

(51) Int. Cl.
*H04B 3/28* (2006.01)

(52) U.S. Cl. .......................... 333/12; 174/36
(58) Field of Classification Search .......... 333/12, 333/181, 185, 243; 174/36, 391
See application file for complete search history.

(56) References Cited

U.S. PATENT DOCUMENTS

| | | | |
|---|---|---|---|
| 4,301,428 A | 11/1981 | Mayer |
| 4,347,487 A | 8/1982 | Martin |
| 4,383,225 A | 5/1983 | Mayer |
| 4,486,721 A | 12/1984 | Cornelius |
| 4,506,235 A | 3/1985 | Mayer |
| 4,510,468 A | 4/1985 | Mayer |

(Continued)

OTHER PUBLICATIONS

Data sheet of MIDCOM Corporation, of 1056 N. Tustin Ave, Anaheim, Calif. 92807, USA, mod.sup.2RJ45.sub.tm, rev.011204, which demonstrates a typical 10/100 BaseT Integrated RJ45 connector, Midcom, Inc., 121 Airport Drive, Watertown, SD 57201, USA http://www.midcom-inc.com/.

(Continued)

*Primary Examiner*—Seungsook Ham
(74) *Attorney, Agent, or Firm*—Mark M. Friedman

(57) ABSTRACT

Apparatus for reducing a common mode (CM) electromagnetic interference (EMI) in a balanced transmission line which carries a differential signal occupying a specified frequency band is described. The apparatus includes a first Single Ended Filter (SEF) operatively associated with a first path of the balanced transmission line, and a second SEF operatively associated with a second path of the balanced transmission line, wherein a ground terminal of the first SEF and a ground terminal of the second SEF are electrically connected to a local ground. Related apparatus and methods are also described.

15 Claims, 20 Drawing Sheets

U.S. PATENT DOCUMENTS

| | | | |
|---|---|---|---|
| 4,888,675 A | 12/1989 | Kumar | |
| 5,077,543 A | 12/1991 | Carlile | |
| 5,095,291 A | 3/1992 | Staschover | |
| 5,109,206 A | 4/1992 | Carlile | |
| 5,281,762 A * | 1/1994 | Long et al. | 174/78 |
| 5,512,196 A | 4/1996 | Mantese | |
| 5,594,397 A | 1/1997 | Uchikoba | |
| 5,756,932 A | 5/1998 | Barnett | |
| 5,825,259 A | 10/1998 | Harpham | |
| 5,847,628 A | 12/1998 | Uchikoba | |
| 5,872,534 A | 2/1999 | Mayer | |
| 6,028,353 A | 2/2000 | Nakano | |
| 6,553,910 B2 | 4/2003 | Fogle | |
| 6,603,080 B2 | 8/2003 | Jenson | |
| 6,778,034 B2 | 8/2004 | Nir et al. | |
| 2001/0042632 A1 | 11/2001 | Manov | |

OTHER PUBLICATIONS

Current data sheet of XMULTIPLE USA Ltd., of 1420 Los Angeles Avenue, Suite G-Simi Valley, Calif. 93065 USA, Part No. XRJH-12-01-10-10-X-FA-XM12 + XRJH-11-01-8-8-X Drawing, dated Jun. 30, 2003, which demonstrates a typical 1000Base-T RJ45 connector; http://www.xmultiple.com/index.htm.

* cited by examiner

```
┌─────────────────────────────────┐
│   PROVIDE AT LEAST FOUR WIRES   │
│    ARRANGED IN A QUAD TRANSMISSION │
│   CONFIGURATION AND CARRYING    │
│  FUNCTIONAL SIGNALS PROPAGATING │
│   OVER THE BALANCED TRANSMISSION│
│              LINE               │
└─────────────────────────────────┘
```

```
┌─────────────────────────────────┐
│    AT LEAST PARTIALLY COAT THE AT│
│   LEAST FOUR WIRES BY AT LEAST ONE│
│   LAYER OF COMPOSITE ABSORBING  │
│  MATERIAL, THE AT LEAST ONE LAYER OF│
│    COMPOSITE ABSORBING MATERIAL │
│  COMPRISING A MIXTURE OF AMORPHOUS│
│  METAL PARTICLES AND AN ISOLATING│
│             MATERIAL            │
└─────────────────────────────────┘
```

```
┌─────────────────────────────────┐
│   SUBSTANTIALLY COAT THE AT LEAST│
│  ONE LAYER OF COMPOSITE ABSORBING│
│   MATERIAL BY AT LEAST ONE      │
│         CONDUCTIVE LAYER        │
└─────────────────────────────────┘
```

```
┌─────────────────────────────────┐
│  CONDUCTIVELY CONNECT THE AT LEAST│
│   ONE CONDUCTIVE LAYER TO A LOCAL│
│              GROUND             │
└─────────────────────────────────┘
```

Fig. 18

ELECTROMAGNETIC INTERFACE MODULE FOR BALANCED DATA COMMUNICATION

CROSS-REFERENCE TO RELATED APPLICATIONS

The present invention claims priority from U.S. Provisional Patent Application Ser. No. 60/528,861, filed 9 Dec. 2003, from U.S. Provisional Patent Application Ser. No. 60/581,007, filed 9 Jun. 2004, and from U.S. Provisional Patent Application Ser. No. 60/614,259, filed 30 Sep. 2004, the disclosures of which are hereby incorporated herein by reference.

FIELD OF THE INVENTION

The present invention generally relates to balanced data communication systems, and more particularly to filters for reducing or eliminating electromagnetic interference (EMI) in balanced data communication systems.

BACKGROUND OF THE INVENTION

Electromagnetic interference is one of the factors that limits range and data rate in data communication systems. In order to reduce interference from ambient electromagnetic environment, data communication systems typically use balanced transmission lines.

In balanced data communication systems a signal appears as the differential mode (DM) current component and interference appears as the common mode (CM) current component. The interference may result from man-made and natural ambient electromagnetic fields, crosstalk, imbalances and mismatching of impedances for DM and CM waves propagating along a transmission line. Reduction or elimination of interference thus requires rejection of the CM component.

Some aspects of technologies and related art that may be useful in understanding the present invention are described in the following publications:

a data sheet of MIDCOM Corporation, of 1056 N. Tustin Ave, Anaheim, Calif. 92807, USA, mod²RJ45$_{tm}$, rev.011204, which demonstrates a typical 10/100 BaseT Integrated RJ45 connector;

a data sheet of XMULTIPLE USA Ltd., of 1420 Los Angeles Avenue, Suite G-Simi Valley, Calif. 93065 USA, Part No. XRJH-12-01-8-C-Z-771 Drawing, dated 30 Jun. 2003, which demonstrates a typical 1000Base-T RJ45 connector;

U.S. Pat. No. 5,594,397 to Uchikoba et al, which describes an electronic filtering part using a material with microwave absorbing properties;

U.S. Pat. No. 5,847,628 to Uchikoba et al, which describes an electronic part using a material with microwave absorbing properties;

U.S. Pat. No. 6,603,080 to Jensen, which describes a circuit board having ferrite powder containing layer;

U.S. Pat. No. 5,756,932 to Barnett, which describes a signal distribution structure having lossy insulator;

U.S. Pat. No. 4,301,428 to Mayer, which describes a radio frequency interference suppressor cable having resistive conductor and lossy magnetic absorbing material;

U.S. Pat. No. 4,383,225 to Mayer, which describes cables with high immunity to electromagnetic pulses (EMP);

U.S. Pat. No. 4,506,235 to Mayer, which describes an EMI Protected cable, with controlled symmetrical/asymmetrical mode attenuation;

U.S. Pat. No. 4,347,487 to Martin, which describes a high frequency attenuation cable; and U.S. Pat. No. 6,553,910 to Fogle, Jr., which describes hermetically-sealed electrically-absorptive low-pass radio frequency filters and electro-magnetically lossy ceramic materials for said filters.

The disclosures of all references mentioned above and throughout the present specification, as well as the disclosures of all references mentioned in those references, are hereby incorporated herein by reference.

SUMMARY OF THE INVENTION

The present invention, in preferred embodiments thereof, seeks to provide an electromagnetic interface module (EIM) for balanced data communication with improved filtering capabilities.

Further objects and features of the present invention will become apparent to those skilled in the art from the following description and the accompanying drawings.

There is thus provided in accordance with a preferred embodiment of the present invention apparatus for reducing a common mode (CM) electromagnetic interference (EMI) in a balanced transmission line which carries a differential signal occupying a specified frequency band, the apparatus including a first Single Ended Filter (SEF) operatively associated with a first path of the balanced transmission line, and a second SEF operatively associated with a second path of the balanced transmission line, wherein a ground terminal of the first SEF and a ground terminal of the second SEF are electrically connected to a local ground.

Preferably, the ground terminal of the first SEF and the ground terminal of the second SEF are electrically connected to the local ground via at least one of the following connections: a direct connection, a connection via a capacitor, and a connection via low-impedance circuitry. The local ground preferably includes at least one of the following: a local conductive chassis ground, a shield of host equipment, a housing of host equipment, a massive printed circuit ground plane, and a massive conductive plate.

Preferably, the first SEF and the second SEF have substantially similar electrical characteristics. Each of the first SEF and the second SEF preferably includes a SEF having an insertion loss which is below an insertion loss threshold at least within the specified frequency band.

Preferably, each of the first path and the second path includes at least one conductor, and each conductor is associated with at least one SEF.

The balanced transmission line preferably includes a twisted pair of conductors.

Preferably, at least one of the apparatus is included in a data link interface module. The data link interface module may also include at least one of the following connectors: an RJ45 connector, a Universal Serial Bus (USB) connector, and a D-type connector.

There is also provided in accordance with a preferred embodiment of the present invention an absorption filter for reducing electromagnetic interference (EMI) in a transmission line, the absorption filter including at least one conductor carrying functional signals propagating over the transmission line, at least one layer of composite absorbing material at least partially coating the at least one conductor, the at least one layer of composite absorbing material including a mixture of amorphous metal particles and an isolating material, and at least one conductive layer substantially coating the at least one layer of composite absorbing material, wherein the at least one conductive layer is conductively connected to a local ground.

Preferably, the transmission line includes one of the following: at least one single-ended transmission line, and at least one balanced transmission line.

The isolating material preferably includes a dielectric material having at least one of the following properties: a dielectric loss greater than a dielectric loss threshold value, and a dielectric constant greater than a dielectric constant threshold value. The isolating material may include Barium Titanate.

Preferably, the local ground includes at least one of the following: a local conductive chassis ground, a shield of host equipment, a housing of host equipment, a massive printed circuit ground plane, and a massive conductive plate.

The at least one conductor preferably includes at least one of the following: a metallic conductor, a conductive adhesive, a conductive paint, a conductive plastic material, and a resin loaded with a conductive material. Preferably, the at least one conductor includes a plurality of pairs of conductors arranged in an arrangement in which an electromagnetic (EM) field generated by a differential-mode (DM) functional signal within a volume occupied by the at least one layer of composite absorbing material is below an EM field threshold level. For example, the at least one conductor may include two pairs of conductors arranged in a quad configuration.

Preferably, the at least one conductor includes at least one of the following: a pair of twisted wires, a multiple of pairs of twisted wires, and a multiple of two pairs of twisted wires.

Preferably, the absorption filter, or a plurality thereof, is included in a data link interface module.

There is also provided in accordance with a preferred embodiment of the present invention a method for reducing a common mode (CM) electromagnetic interference (EMI) in a balanced transmission line which carries a differential signal occupying a specified frequency band, the method including associating a first Single Ended Filter (SEF) with a first path of the balanced transmission line, associating a second SEF with a second path of the balanced transmission line, and electrically connecting a ground terminal of the first SEF and a ground terminal of the second SEF to a local ground.

Further in accordance with a preferred embodiment of the present invention there is provided a method for reducing a common mode (CM) electromagnetic interference (EMI) in a balanced transmission line, the method including providing a local ground for grounding, connecting a SEF in series to each conductor of each one of two paths included in the balanced transmission line, and connecting at least one ground terminal electrode of each SEF to the local ground.

Also in accordance with a preferred embodiment of the present invention there is provided a method for reducing electromagnetic interference (EMI) in a transmission line, the method including providing at least one conductor carrying functional signals propagating over the transmission line, at least partially coating the at least one conductor by at least one layer of composite absorbing material, the at least one layer of composite absorbing material including a mixture of amorphous metal particles and an isolating material, substantially coating the at least one layer of composite absorbing material by at least one conductive layer, and conductively connecting the at least one conductive layer to a local ground.

Further in accordance with a preferred embodiment of the present invention there is provided a method for reducing electromagnetic interference (EMI) in a balanced transmission line, the method including providing at least four wires arranged in a quad transmission configuration and carrying functional signals propagating over the balanced transmission line, at least partially coating the at least four wires by at least one layer of composite absorbing material, the at least one layer of composite absorbing material including a mixture of amorphous metal particles and an isolating material, substantially coating the at least one layer of composite absorbing material by at least one conductive layer, and conductively connecting the at least one conductive layer to a local ground.

BRIEF DESCRIPTION OF THE DRAWINGS

The present invention will be understood and appreciated more fully from the following detailed description, taken in conjunction with the drawings in which:

FIG. 18 is a simplified flowchart illustration of a preferred method of operation of any of the absorption filter of FIG. 12 and the absorption filter of FIG. 13.

DETAILED DESCRIPTION OF A PREFERRED EMBODIMENT

Figure 1:
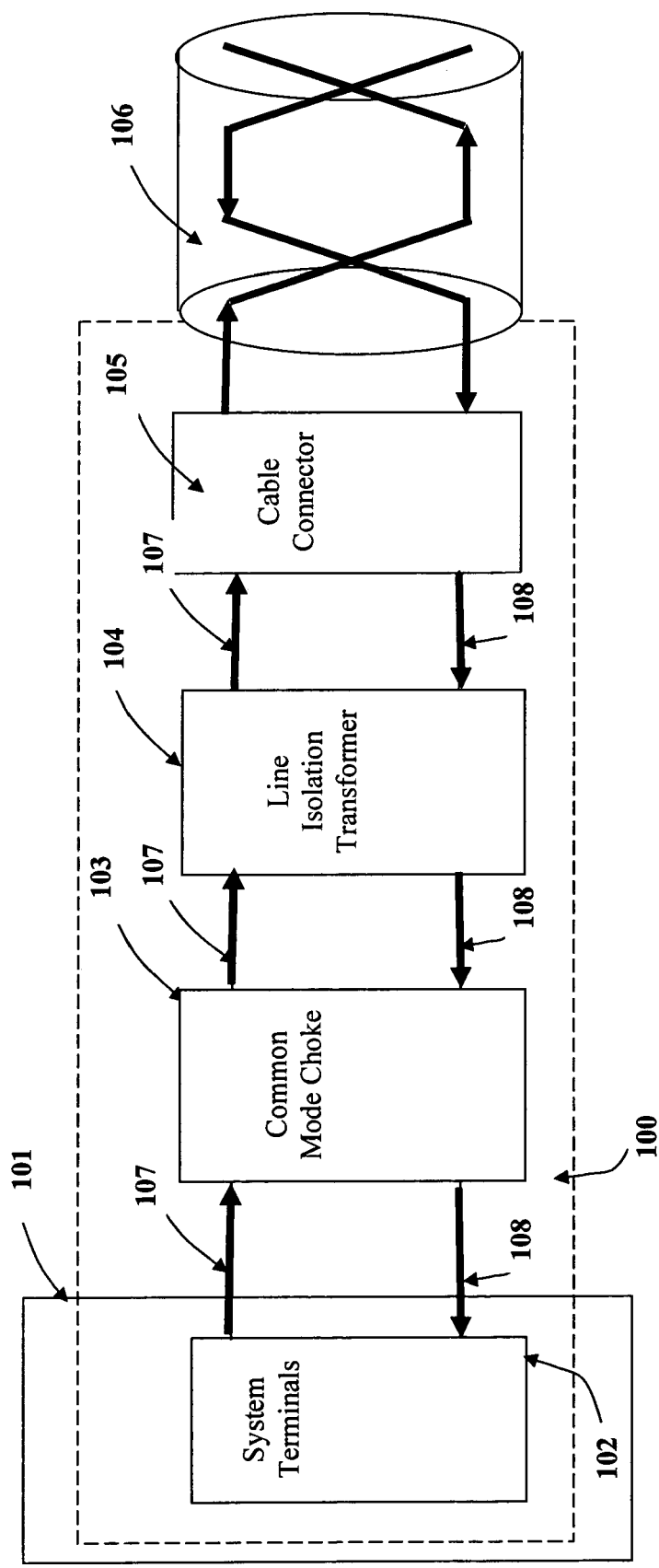
FIG. 1 is a simplified block diagram illustration of a prior art electromagnetic interface module (EIM) for a single balanced communication interface.

Reference is now made to FIG. 1, which is a simplified block diagram illustration of a prior art electromagnetic interface module (EIM) 100 for a single balanced communication interface. The EIM 100 is associated with a printed circuit board (PCB) 101 and system terminals 102 and includes commercially available components comprising: a common mode chock (CMC) 103; a line isolation transformer 104; a cable connector 105 connected to a data communication cable 106; conductors 107 for flow of a forward (positive) signal current; and conductors 108 for flow of a backward (negative) signal current. The EIM 100 may be used on conventional 10/100BaseT and 1000BaseT local area network (LAN) interfaces.

Commercially available EIMs suffer from low common mode (CM) rejection at frequencies above 150 MHz. Yet, there is a continuous need for lower cost EIMs supporting signals at higher speeds and complying with more restrictive electromagnetic compatibility (EMC) regulations.

Figure 2:
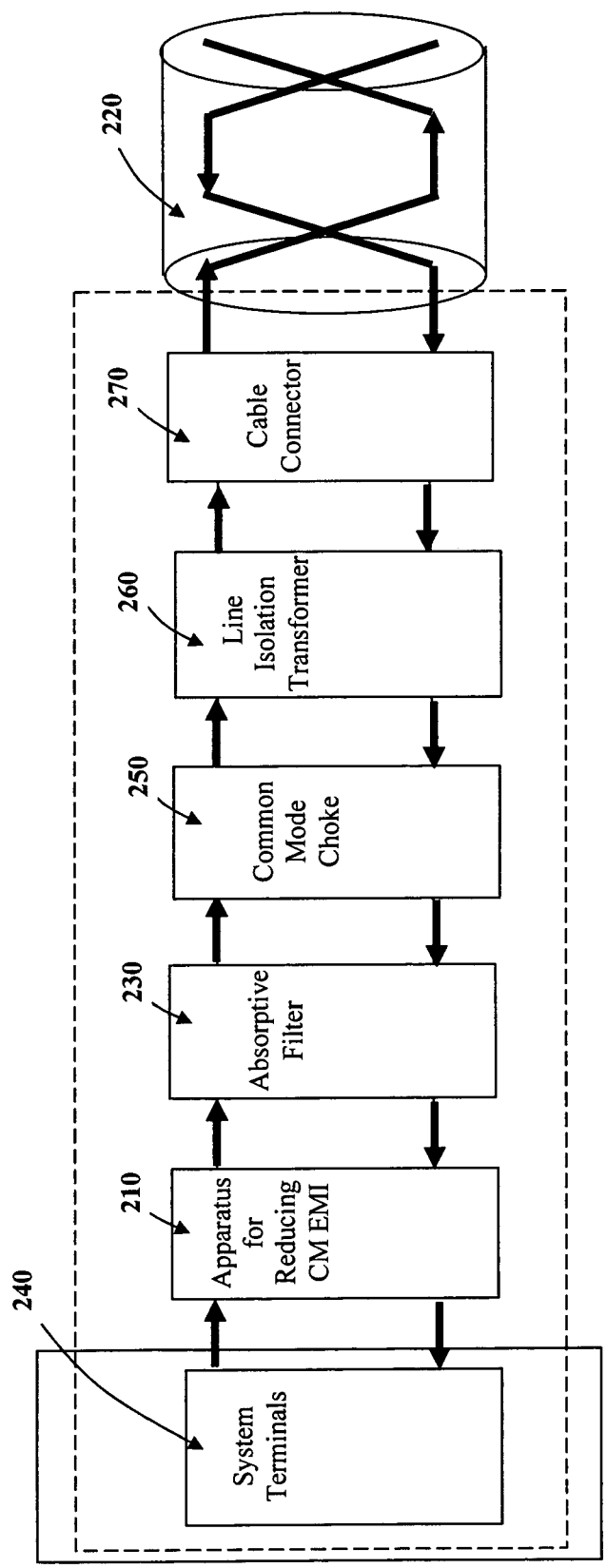
FIG. 2 is a simplified partly pictorial partly block diagram illustration of a preferred implementation of an EIM constructed and operative in accordance with a preferred embodiment of the present invention.

Reference is now made to FIG. 2, which is a simplified partly pictorial partly block diagram illustration of a preferred implementation of an EIM 200 constructed and operative in accordance with a preferred embodiment of the present invention. In addition to conventional elements as in the EIM 100 of FIG. 1, the EIM 200 preferably includes apparatus 210 for reducing a CM electromagnetic interference (EMI) in a balanced transmission line 220 which carries a differential signal occupying a specified frequency band, and an absorption filter 230. The term "balanced transmission line" is used throughout the present specification and claims to include a line having conductors with equal resistance per unit length and equal capacitance and inductance between each conductor and ground.

The apparatus 210 is preferably operatively associated with conventional system terminals 240 and the absorption filter 230. The EIM 200 may optionally include a conventional CMC 250 in which case the absorption filter 230 is operatively associated with the CMC 250. The CMC 250 is connected to a line isolation transformer 260 that is also comprised in the EIM 200, and the line isolation transformer 260 is connected to the balanced transmission line 220 via a cable connector 270. In a case where the EIM 200 does not include the CMC 250, the absorption filter 230 is preferably operatively associated with the line isolation transformer 260.

Figure 3:
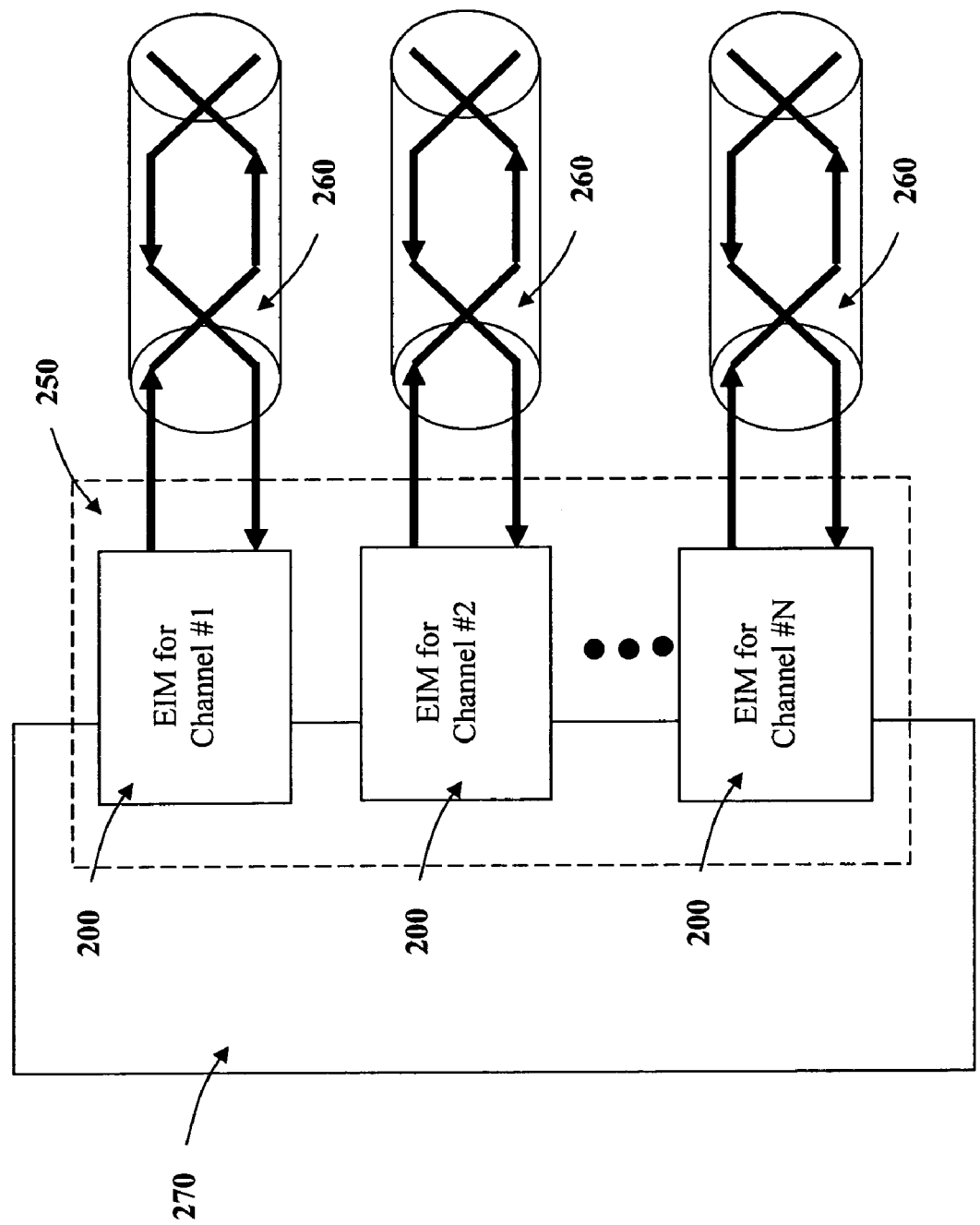
FIG. 3 is a simplified block diagram illustration of a preferred implementation of an integrated EIM comprising more than one of the EIM of FIG. 2, the integrated EIM being constructed and operative in accordance with a preferred embodiment of the present invention.

Reference is now made to FIG. 3, which is a simplified block diagram illustration of a preferred implementation of an integrated EIM 250 comprising more than one of the EIM 200 of FIG. 2, the integrated EIM 250 being constructed and operative in accordance with a preferred embodiment of the present invention. The integrated EIM 250 is associated with N channels 260, where N is an integer greater than one. Each of the N channels 260 is operatively associated with an EIM 200, and all the EIMs 200 that are associated with the N channels 260 are preferably comprised in the integrated EIM 250. The integrated EIM 250 is preferably operatively associated with a PCB 270.

Figure 4:
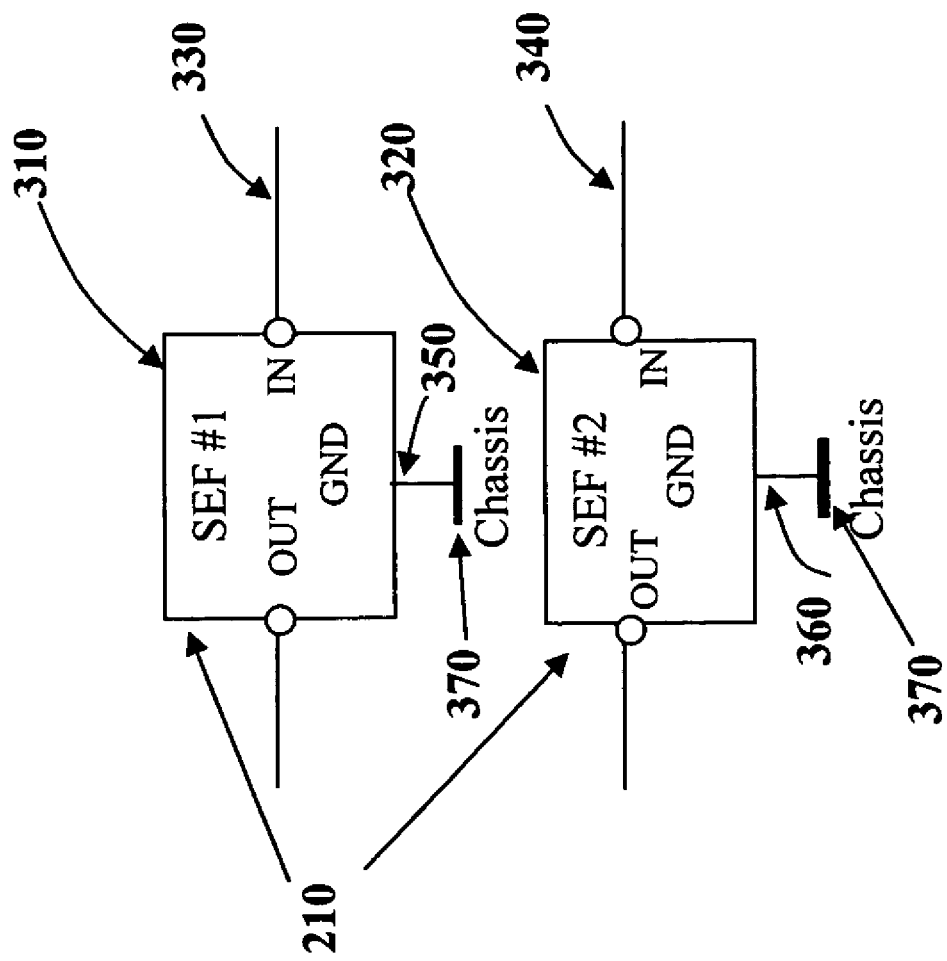
FIG. 4 is a simplified partly pictorial partly block diagram illustration of a preferred implementation of apparatus in the EIM of FIG. 2 for reducing a CM electromagnetic interference in a balanced transmission line which carries a differential signal occupying a specified frequency band, the apparatus being constructed and operative in accordance with a preferred embodiment of the present invention.

Reference is now made to FIG. 4, which is a simplified partly pictorial partly block diagram illustration of a preferred implementation of the apparatus 210 in the EIM 200 of FIG. 2, the apparatus 210 being constructed and operative in accordance with a preferred embodiment of the present invention. It is appreciated that at least one of the apparatus 210 may be comprised in a data link interface module (not shown) and/or in a balanced data communication system (not shown). The data link interface module may preferably include at least one of the following: an RJ45 connector; a Universal Serial Bus (USB) connector; and a D-type connector.

The apparatus 210 preferably includes a first Single Ended Filter (SEF) 310 and a second SEF 320. The term "Single Ended Filter" is used throughout the present specification and claims to include an unbalanced filter circuit, as when one part of the unbalanced filter circuit is grounded.

The SEF 310 is preferably operatively associated with a first path 330 of a balanced transmission line, and the SEF 320 is preferably operatively associated with a second path 340 of the balanced transmission line. The SEF 310 and the SEF 320 are preferably separate from each other, that is, there is no electrical connection between the SEF 310 and the SEF 320.

Preferably, each of the first path 330 and the second path 340 includes at least one conductor which is associated with at least one of the SEF 310 and the SEF 320. The balanced transmission line preferably includes a twisted pair of conductors in which case the first path 330 preferably includes a first conductor of the twisted pair, and the second path 340 preferably includes a second conductor of the twisted pair.

In accordance with a preferred embodiment of the present invention a ground terminal electrode 350 of the first SEF 310 and a ground terminal electrode 360 of the second SEF 320 are electrically connected to a local ground 370. The SEF 310 and the SEF 320 are therefore preferably grounded via an electrical connection. The electrical connection preferably includes at least one of the following connections: a direct connection; a connection via a capacitor; and a connection via low-impedance circuitry.

The local ground 370 preferably includes a local chassis ground comprising at least one of the following: a local conductive chassis ground; a shield of host equipment; a housing of host equipment; a massive printed circuit ground plane; and a massive conductive plate.

Preferably, the SEF 310 and the SEF 320 have substantially similar electrical characteristics. Each of the SEF 310 and the SEF 320 preferably includes at least one of the following: a low-pass filter (LPF); and a band-pass filter (BPF). Each of the SEF 310 and the SEF 320 preferably includes a SEF having an insertion loss which is below an insertion loss threshold at least within a specified frequency band occupied by a differential signal carried over the balanced transmission line. The insertion loss threshold may, for example, be 1 dB within a frequency band below 80 MHz which is occupied by a 100BaseT differential-mode signal, as in many commercially available RJ45 connectors integrated with EMI filters.

Figure 5:
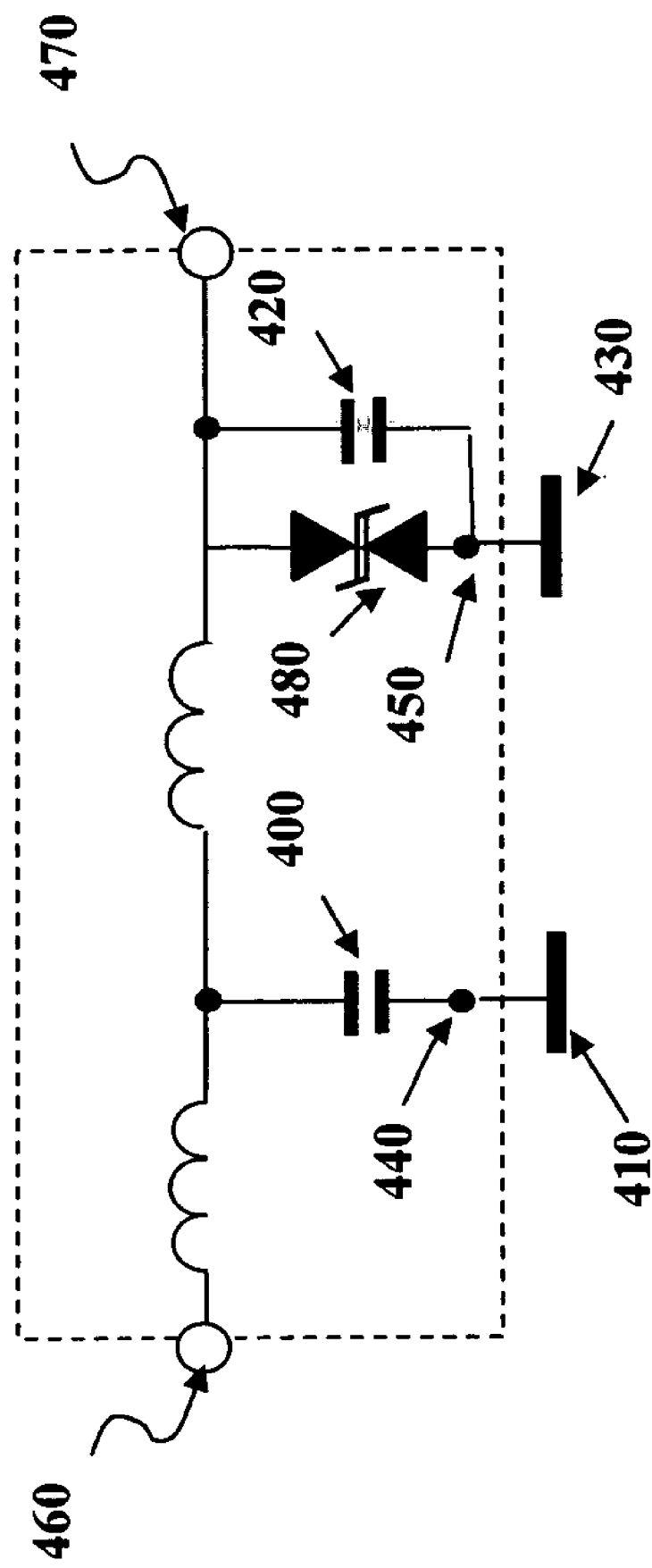
FIG. 5 is a circuit diagram of a typical low-pass Single-Ended Filter (SEF)

Preferably, each of the SEF 310 and the SEF 320 includes at least one of the following types of SEF: a Butterworth SEF; a Chebyshev SEF; an Elliptic SEF; and a ladder SEF. A typical embodiment of each of the SEF 310 and the SEF 320 in a configuration of a low-pass SEF of the ladder type is depicted in FIG. 5. A typical embodiment of each of the SEF 310 and the SEF 320 in a configuration of a band-pass SEF of the ladder type is depicted in FIG. 6.

The low-pass SEF in FIG. 5 preferably includes at least one capacitor referred to ground. By way of example, a capacitor 400 is referred to ground 410 and a capacitor 420 is referred to ground 430. The capacitors 400 and 420 are preferably referred to ground via ground terminals 440 and 450 that are preferably connected by a low-impedance connection to the ground 410 and the ground 430, respectively. Each of the ground 410 and the ground 430 preferably includes a local ground comprising at least one of the following: a local conductive chassis ground; a shield of host equipment; a housing of host equipment; a massive printed circuit ground plane; and a massive conductive plate (all not shown). The low-pass SEF is preferably connected in series to one of the paths 330 and 340 of FIG. 4 via terminals 460 and 470. It is appreciated that transient protection elements, such as Transient Voltage Suppressor (TVS) diodes 480 may optionally be comprised in the low-pass SEF. It is further appreciated that junction capacitances of TVS diodes are part of SEF capacitance.

Figure 6:
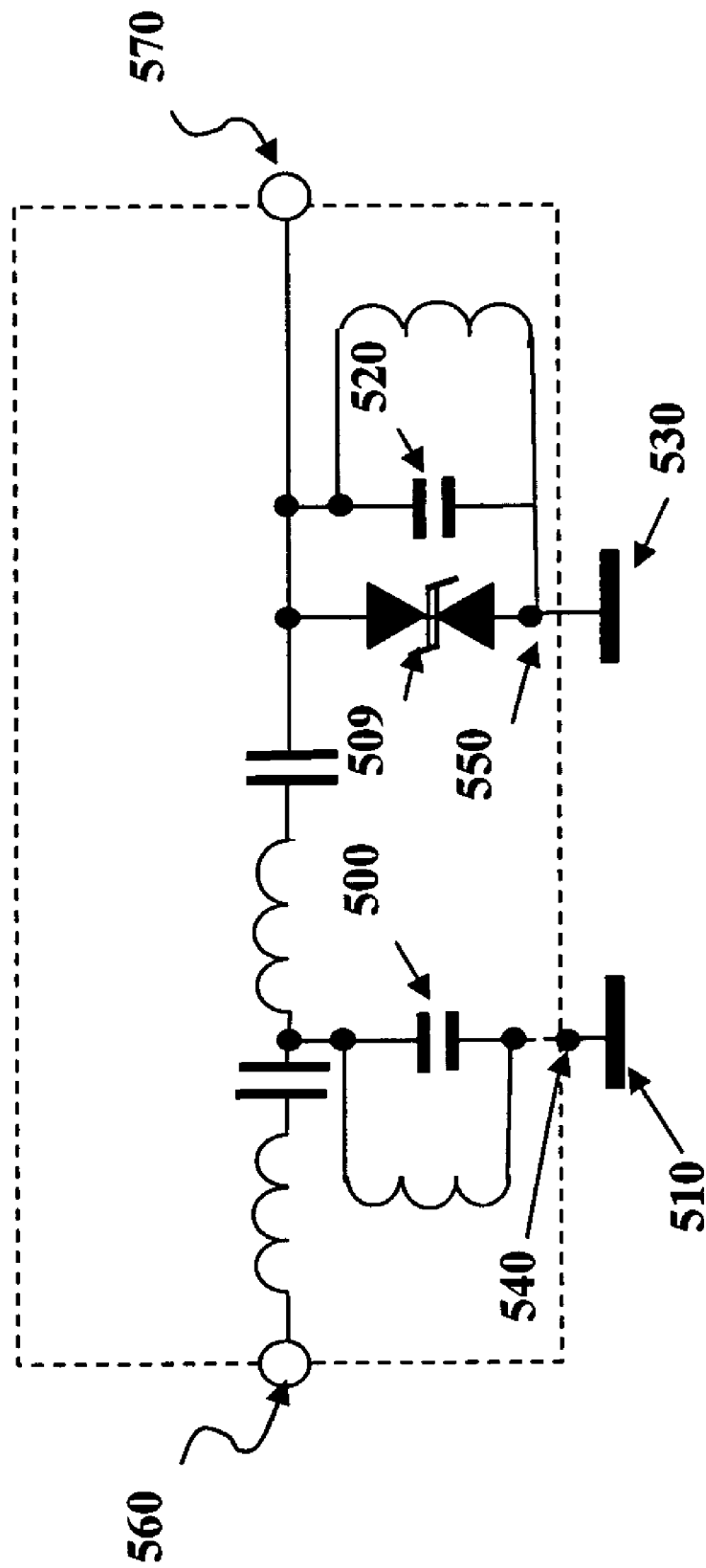
FIG. 6 is a circuit diagram of a typical band-pass SEF.

The band-pass SEF in FIG. 6 also preferably includes at least one capacitor referred to ground terminals. By way of example, a capacitor 500 is referred to a local ground 510 and a capacitor 520 is referred to a local ground 530. The capacitors 500 and 520 are preferably referred to ground via ground terminals 540 and 550 that are preferably connected by a low-impedance connection to the ground 510 and the ground 530, respectively. Each of the ground 510 and the ground 530 preferably includes a local ground comprising at least one of the following: a local conductive chassis ground; a shield of host equipment; a housing of host equipment; a massive printed circuit ground plane; and a massive conductive plate (all not shown). The band-pass SEF is preferably connected in series to one of the paths 330 and 340 of FIG. 4 via terminals 560 and 570.

Referring now back to FIG. 4, the operation of the apparatus 210 is now briefly described.

Preferably, the local ground 370 is provided for grounding of the ground terminals 350 and 360 of the SEFs 310 and 320. The SEF 310 is preferably operatively associated with the first path 330 of the balanced transmission line, for example by connecting the SEF 310 in series to each conductor in the first path 330. The SEF 320 is preferably operatively associated with the second path 340 of the balanced transmission line, for example by connecting the SEF 320 in series to each conductor in the second path 340. The ground terminal electrode 350 of the SEF 310 and the ground terminal electrode 360 of the SEF 320 are preferably electrically connected to the local ground 370, for example, via a low-impedance connection to the base.

In conventional balanced data communication systems, LPFs are used in differential-mode (DM) configurations. Such LPFs do not have a ground terminal bonded to a local ground, such as an equipment chassis. Naturally, such LPFs provide filtering of DM signals and are not effective for CM rejection. The present invention, in preferred embodiments thereof, provides an electromagnetic interface (EIM) for balanced data communication in which ground terminals of SEFs are electrically connected to a local ground to obtain CM reduction or rejection.

Figure 6A:
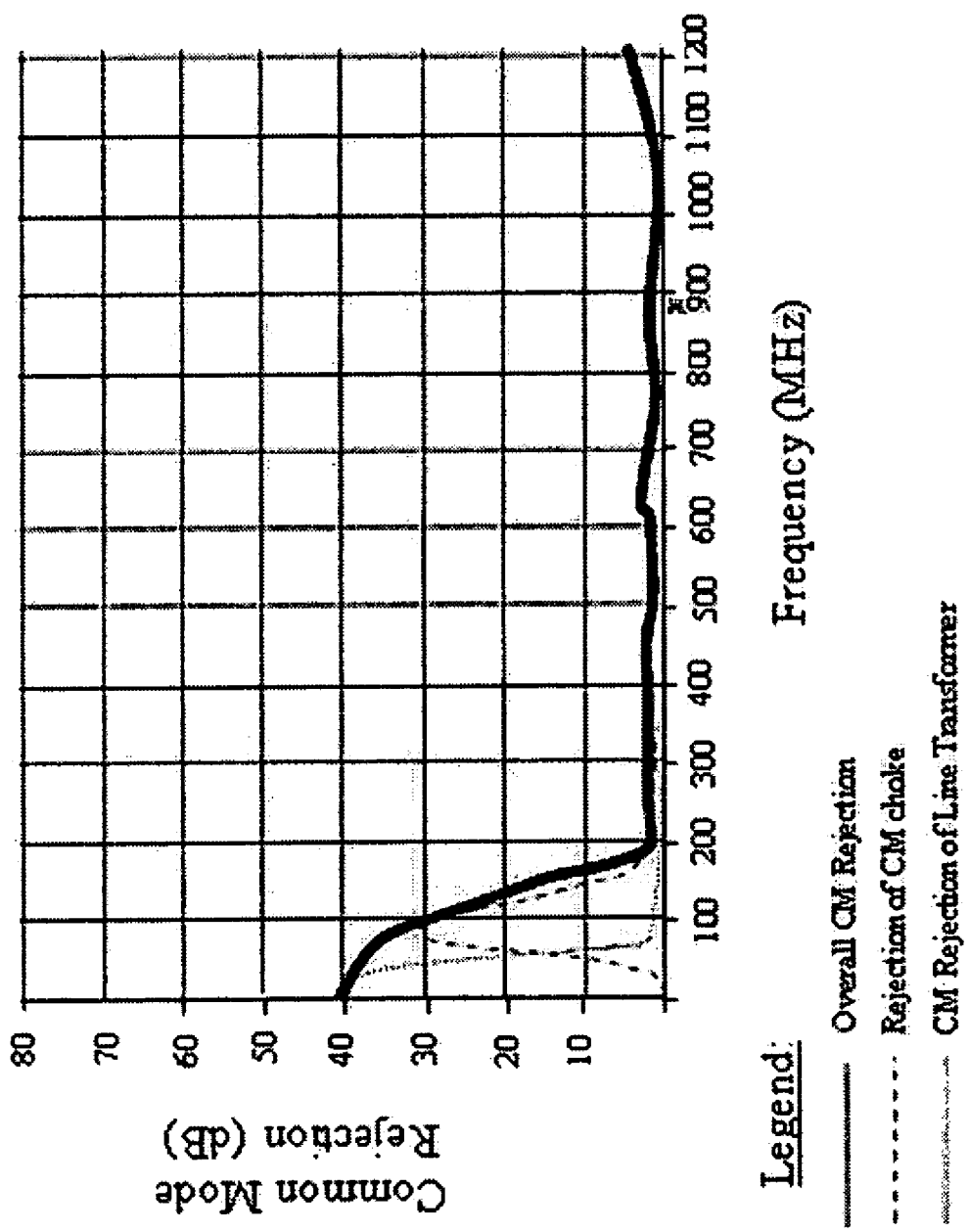
FIGS. 6A and 6B demonstrate CM rejection of an EIM including the apparatus of FIG. 4 (shown in FIG. 6B) versus CM rejection of commercially available integrated interface modules (shown in FIG. 6A)
Figure 6B:
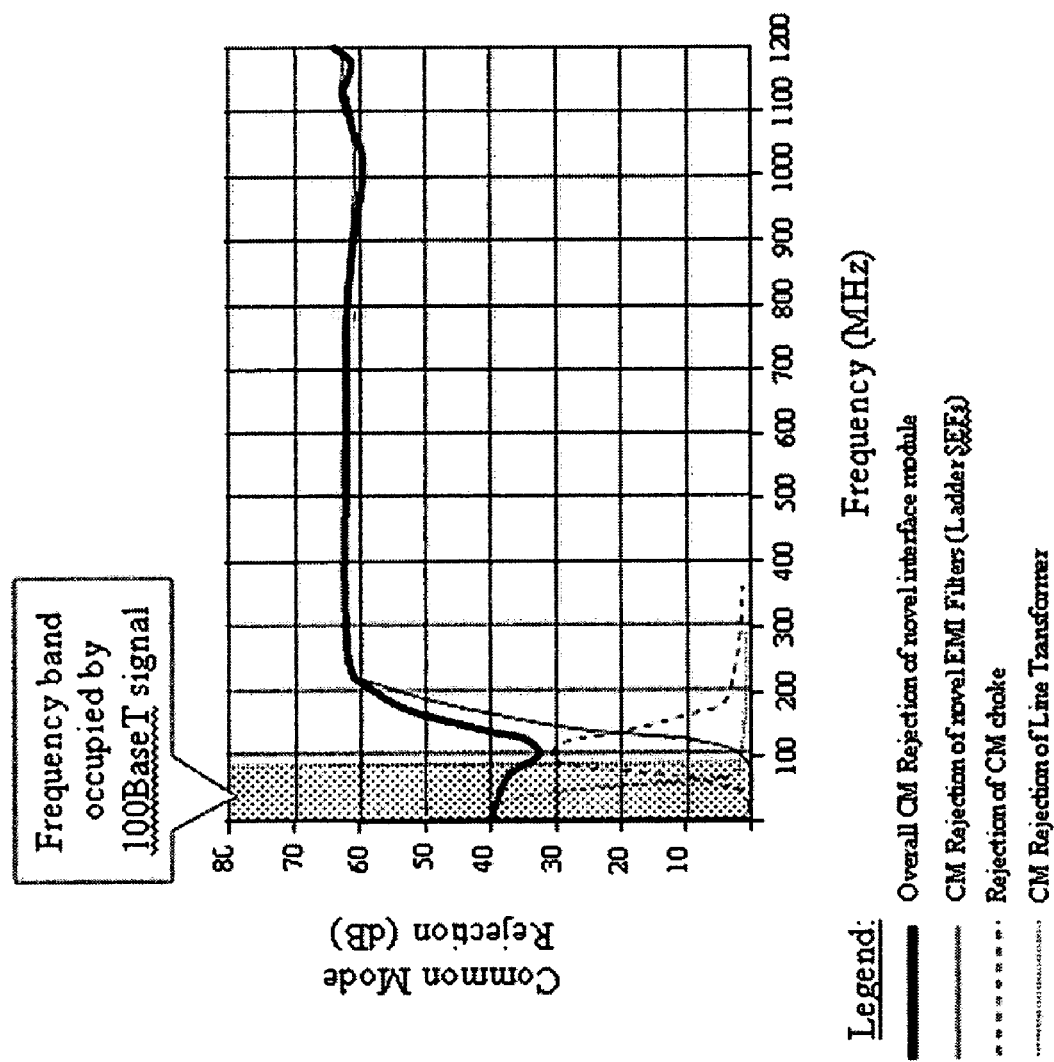

The apparatus 210 is intended to provide low DM attenuation within a frequency band occupied by a spectrum of the DM signal, high attenuation in all other frequencies, and as much as possible CM noise rejection at any frequency. A plurality of the apparatus 210 may be used for CM noise rejection in a plurality of balanced data communication channels. It is appreciated that connection of the ground terminal electrode 350 of the SEF 310 and the ground terminal electrode 360 of the SEF 320 to the local ground 370 results in significantly enhanced attenuation for both DM and CM interference signals when compared to conventional implementations. Demonstrations of CM rejection of an EIM including the apparatus 210 versus CM rejection of commercially available integrated interface modules are shown in FIGS. 6B and 6A, respectively. It is appreciated that the apparatus 210 provides CM reduction in the range of at least 80 MHz–1.3 GHz where conventional CM chokes and LAN transformers have relatively degraded performance. The apparatus 210 also enables low-cost manufacturing and miniature packaging.

Figure 7:
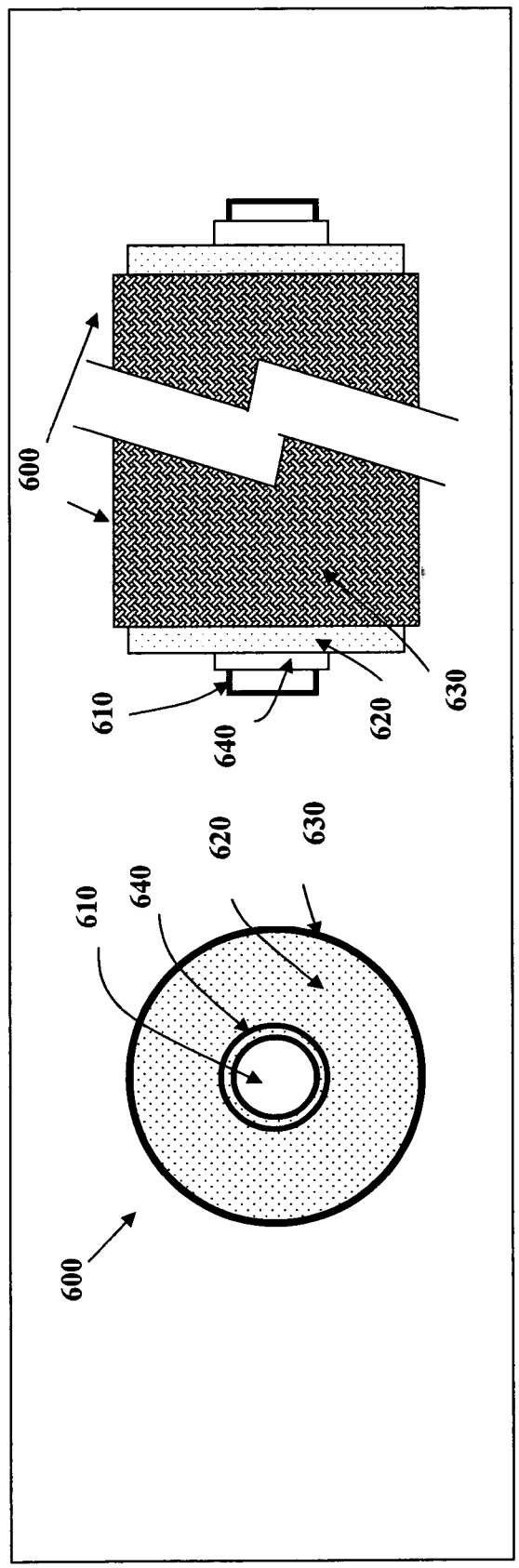
FIG. 7 is a simplified partly pictorial partly block diagram illustration of a preferred implementation of a single-ended absorption filter, the single-ended absorption filter being constructed and operative in accordance with a preferred embodiment of the present invention.

Reference is now made to FIG. 7, which is a simplified partly pictorial partly block diagram illustration of a preferred implementation of a single-ended absorption filter 600, the single-ended absorption filter 600 being constructed and operative in accordance with a preferred embodiment of the present invention. The absorption filter 600 is preferably used for reducing EMI in a transmission line (not shown). The transmission line preferably includes one of the following: at least one single-ended transmission line; and at least one balanced transmission line.

It is appreciated that absorption filter 600 may be comprised in a data link interface module (not shown) and/or in a balanced data communication system (not shown).

Preferably the absorption filter 600 includes the following elements: at least one conductor 610; at least one layer of composite absorbing material 620; and at least one conductive layer 630. The at least one conductor 610 preferably carries functional signals propagating over the transmission line.

The at least one conductor 610 preferably includes at least one of the following: a metallic conductor; a conductive adhesive; a conductive paint; a conductive plastic material; and a resin loaded with a conductive material. In a case where the at least one conductor 610 includes a metallic conductor, the metallic conductor preferably includes at least one of the following: a pair of twisted wires; a multiple of pairs of twisted wires; and a multiple of two pairs of twisted wires. It is appreciated that the at least one conductor 610 may be coated by an isolation layer 640.

The at least one layer of composite absorbing material 620 at least partially coats the at least one conductor 610. The at least one conductive layer 630 preferably substantially coats the at least one layer of composite absorbing material 620. Preferably, the at least one conductive layer 630 is conductively connected to a local ground (not shown) at least at one location (not shown). Conductive connection of the at least one conductive layer 630 is preferably obtained via an electrical connection. The electrical connection preferably includes at least one of the following connections: a direct connection; a connection via a capacitor; and a connection via low-impedance circuitry.

The local ground preferably includes at least one of the following: a local conductive chassis ground; a shield of host equipment; a housing of host equipment; a massive printed circuit ground plane; and a massive conductive plate (all not shown).

The at least one layer of composite absorbing material 620 preferably includes a mixture of amorphous metal particles and an isolating material. The amorphous metal particles are preferably immersed in the isolating material. By way of example, which is not meant to be limiting, the amorphous metal particles include a Cobalt-based alloy comprising Cobalt (Co) as the principal material. The Cobalt-based alloy includes, for example which is not meant to be limiting, one of the following compositions of materials:

(1) A composition of materials comprising, in weight, the following: 0.067% Oxygen, 11.709% Boron, 12.648% Silicon, 3.605% Chromium, 4.269% Iron, 0.051% Nickel, and 67.651% Cobalt.

(2) A composition of materials comprising, in weight, the following: 0.083% Oxygen, 11.143% Boron, 12.569% Silicon, 3.732% Chromium, 3.625% Iron, 0.151% Nickel, and 68.697% Cobalt.

Cobalt-based alloy compositions similar to the Compositions (1) and (2) but with weights deviating from the weights in each of the Compositions (1) and (2) by up to +/−20% in quantity of each material are also appropriate.

The isolating material preferably includes a dielectric material having at least one of the following properties: a dielectric loss greater than a dielectric loss threshold value; and a dielectric constant greater than a dielectric constant threshold value. The dielectric constant threshold may, for example, be a relative dielectric constant of several tens, several hundreds or even several thousands. The dielectric loss threshold value may, for example, be $\tan(\delta)<0.01$.

By way of example, which is not meant to be limiting, the isolating material includes Barium Titanate.

The operation of the absorption filter 600 of FIG. 7 is now briefly described.

Figure 8:
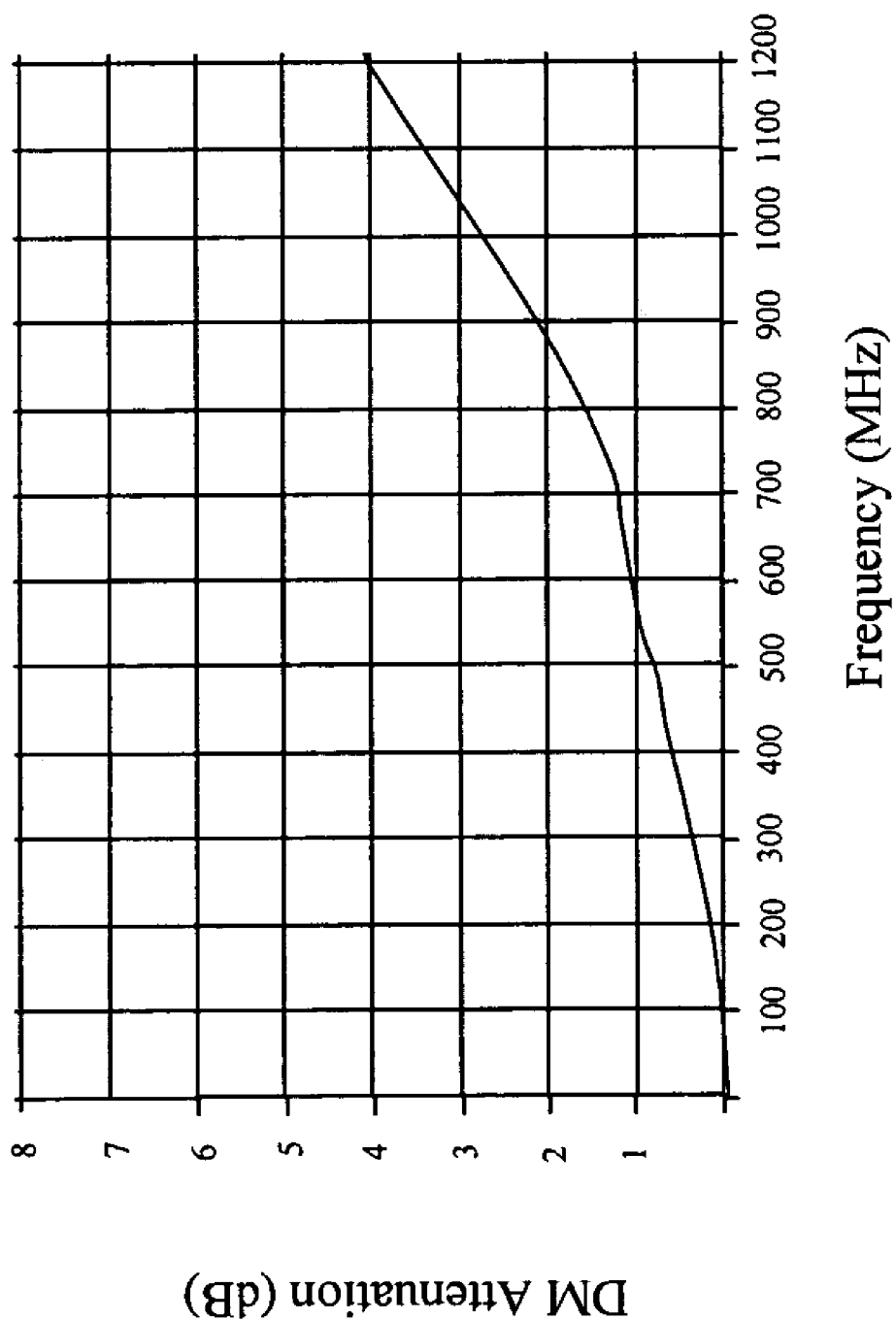
FIG. 8 is a graph showing differential mode (DM) attenuation performance of the absorption filter of FIG. 7 with an interaction length of 100 mm and utilization of a twisted pair of round wires.
Figure 9:
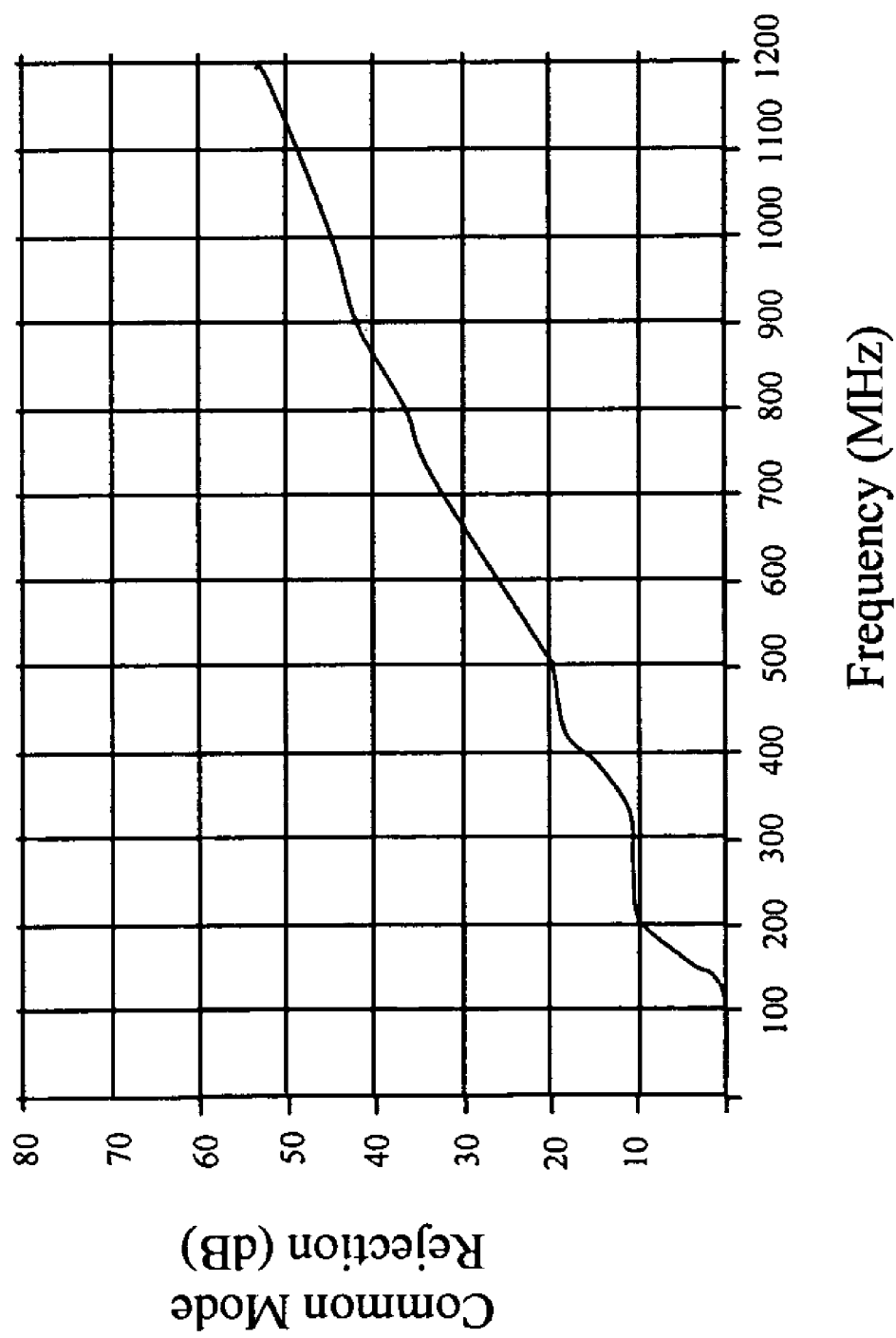
FIG. 9 is a graph showing common mode (CM) rejection performance of the absorption filter of FIG. 7 with an interaction length of 100 mm.

The absorption filter 600 is intended to provide enhanced CM attenuation at frequencies above 200–300 MHz, and even higher CM attenuation at frequencies of 1–20 GHz. By way of example, which is not meant to be limiting, and under an exemplary assumption that a length of a structure comprising the absorption filter 600 exceeds 100 mm, the absorption filter 600 attenuates CM interference signals by at least 40–50 dB above 1 GHz. It is appreciated that the absorption filter 600 may be complimentary to conventional EMI L-C filters above 1–2 GHz, where parasitic elements of EMI L-C filters deteriorate their performance. The absorption filter 600 also preferably provides appropriate low attenuation to DM signals, typically up to 2–3 dB DM loss in a frequency band up to several hundreds of MHz. Thus, the absorption filter 600 is useful for high-speed data communication applications. DM Attenuation performance of the absorption filter 600 with an interaction length of 100 mm and utilization of a twisted pair of round wires is shown in FIG. 8. CM Rejection performance of the absorption filter 600 with an interaction length of 100 mm is shown in FIG. 9.

It is appreciated that the absorption filter 600 also provides a high degree of isolation between receive and transmit channels. The absorption filter 600 also may be implemented in a miniature package and offers low-cost manufacturing.

The operation of the absorption filter 600 is based upon different spatial distribution of electromagnetic fields generated by DM and CM currents propagating along data communication transmission lines. Attenuation versus frequency response may be controlled by the at least one layer of composite absorbing material 620, cross-sectional geometry, and length of interaction between the transmission line and the at least one layer of composite absorbing material 620.

In the absorption filter 600 confinement of a dissipated electromagnetic field of an interference signal inside the at least one layer of composite absorbing material 620 is achieved by longwise coating of the at least one layer of composite absorbing material 620 by the at least one conductive layer 630. Absorption preferably occurs on the surfaces of the amorphous metal particles. Isolation between the metal particles enables better penetration of the electromagnetic field into the composite absorbing material. Conventional methods may be applied in order to achieve a desired isolation between the metal particles.

Figure 10:
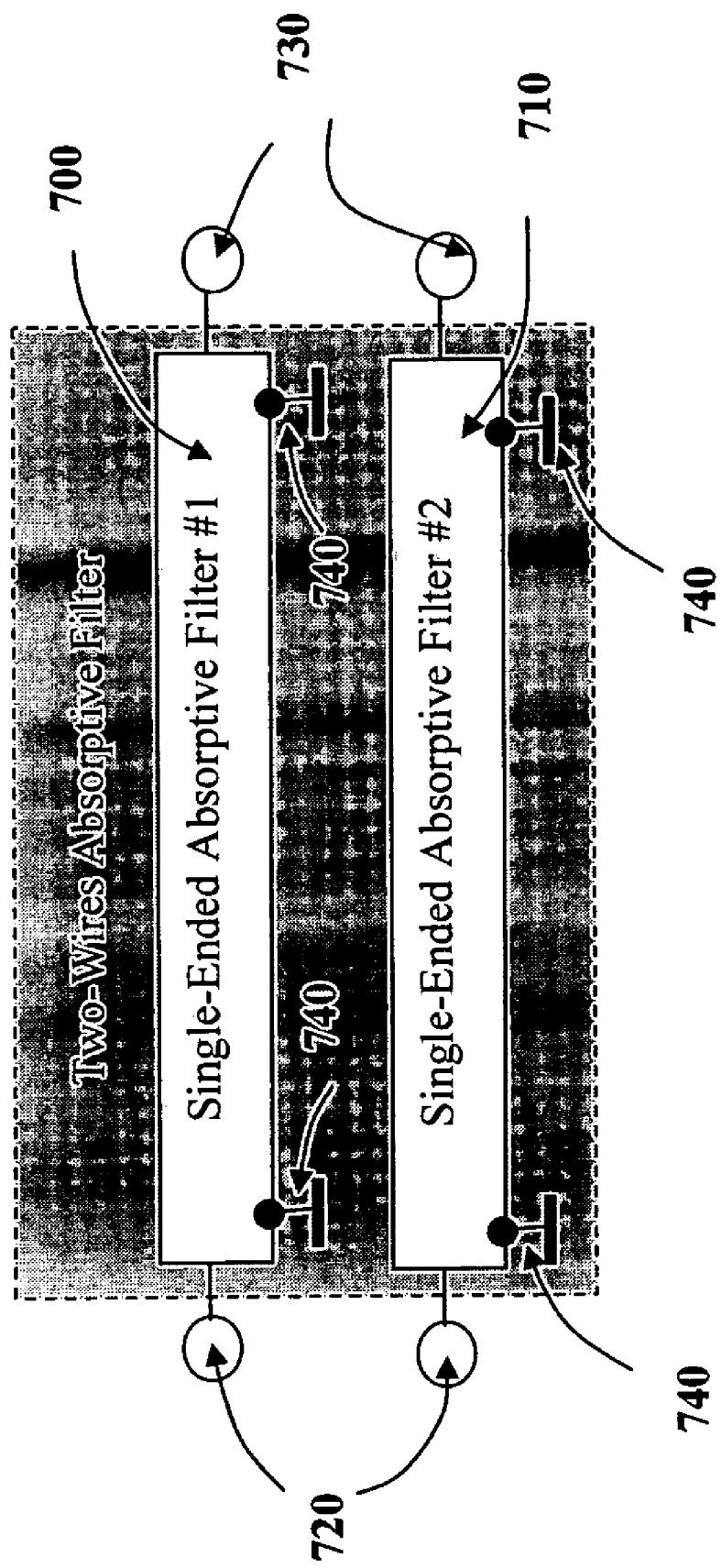
FIG. 10 is a simplified partly pictorial partly block diagram illustration of a preferred implementation of two single-ended absorption filters on a balanced transmission line in accordance with a preferred embodiment of the present invention.

Reference is now made to FIG. 10, which is a simplified partly pictorial partly block diagram illustration of a preferred implementation of two single-ended absorption filters 700 and 710 on a balanced transmission line in accordance with a preferred embodiment of the present invention.

The balanced transmission line is operatively associated with the absorption filters 700 and 710 at an input port 720 and at an output port 730. Each of the absorption filters 700 and 710 may be similar in structure and functionality to the absorption filter 600 of FIG. 7. The absorption filters 700 and 710 are preferably conductively connected to a local ground at locations 740.

The absorption filters 700 and 710 attenuate both DM signals and CM signals. Such unselected attenuation implies that a configuration as depicted in FIG. 10 may be used only for low-speed signals with a spectrum occupying low frequencies, where the absorption filters 700 and 710 have negligible loss.

Figure 11:
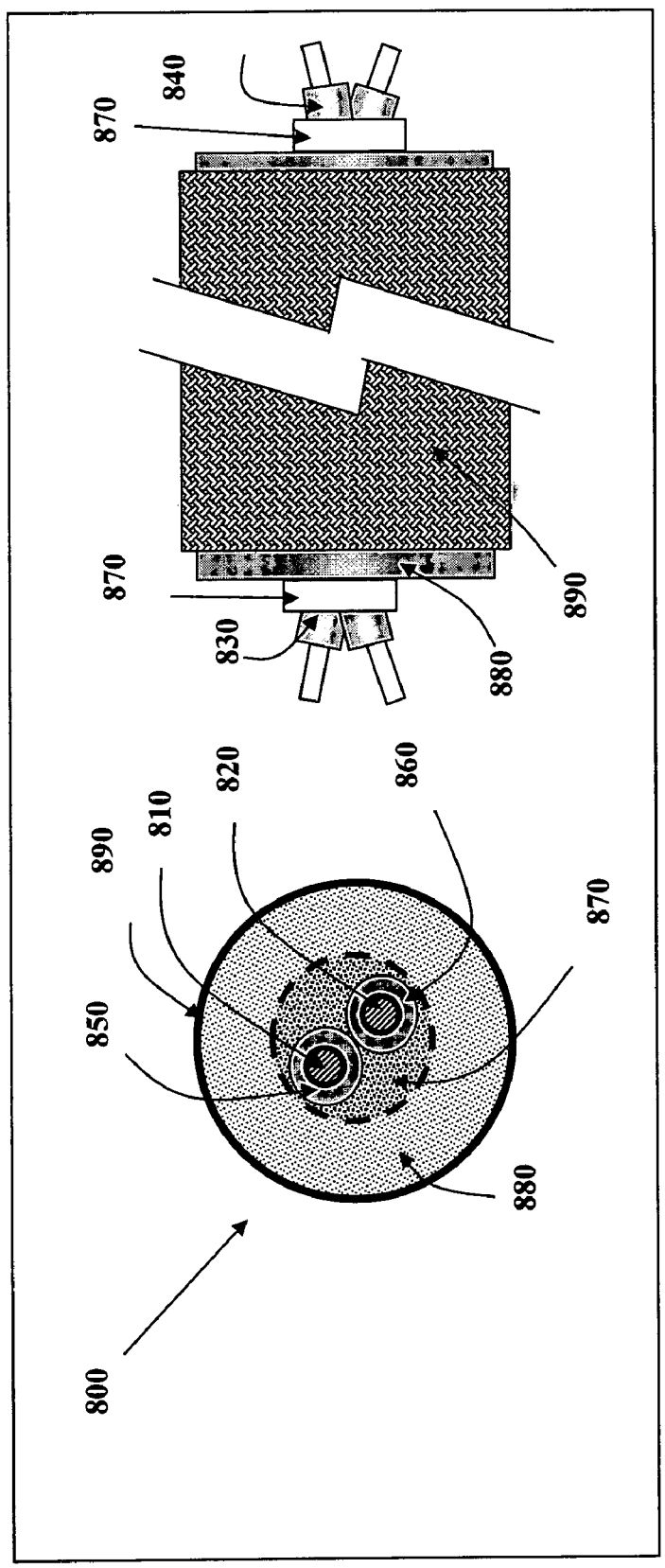
FIG. 11 is a simplified partly pictorial partly block diagram illustration of a preferred implementation of a balanced absorption filter, the balanced absorption filter being constructed and operative in accordance with a preferred embodiment of the present invention.

Reference is now made to FIG. 11, which is a simplified partly pictorial partly block diagram illustration of a preferred implementation of a balanced absorption filter 800, the balanced absorption filter 800 being constructed and operative in accordance with a preferred embodiment of the present invention. The balanced absorption filter 800 is intended to reduce DM insertion loss as well as to provide CM rejection.

The absorption filter 800 is similar in structure and functionality to the absorption filter 600 except that the absorption filter 800 embeds a twisted pair of isolated wires 810 and 820 carrying DM functional signals and CM interference signals that propagate from an input side 830 of a balanced transmission line to an output side 840 of the balanced transmission line.

Each of the wires 810 and 820 may be electrically isolated by dielectric layers 850 and 860, respectively.

In applications requiring low DM loss in a broad frequency range (several hundreds of MHz and more), the pair of wires 810 and 820 may also be surrounded by a layer of low-loss dielectric material 870. The layer 870, together with the pair of wires 810 and 820, preferably forms a cylinder with a diameter which is approximately a diameter of the dielectric layers 850 and 860 multiplied by a factor of 2. It is appreciated that the layer 870 is optional in applications that use signals that occupy frequencies below 200 MHz. The layer 870 is preferably surrounded by at least one layer of absorption material 880 which is preferably coated by at least one layer of conductive material 890.

Figure 12:
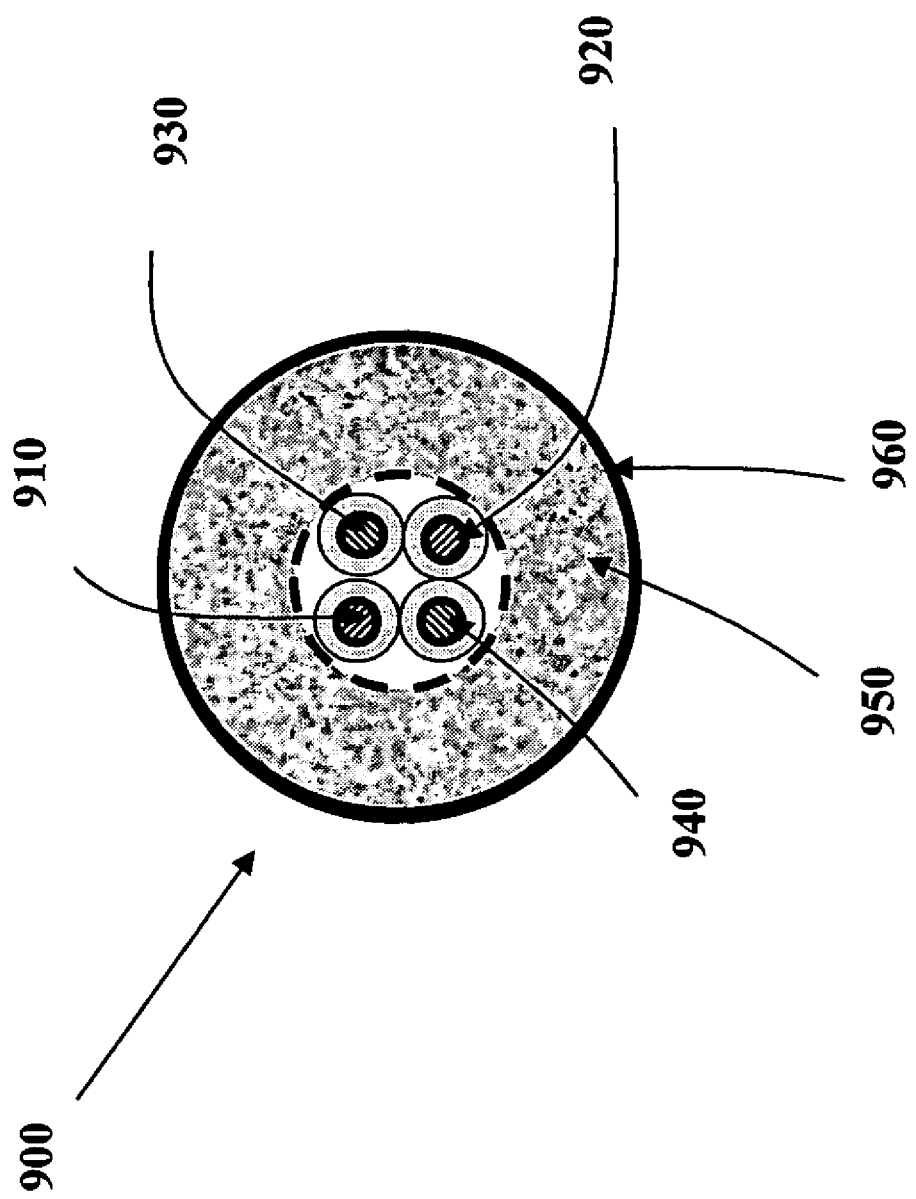
FIG. 12 is a simplified pictorial illustration of a preferred implementation of an absorption filter operating on a quad transmission line, the absorption filter being constructed and operative in accordance with a preferred embodiment of the present invention.

Reference is now made to FIG. 12, which is a simplified pictorial illustration of a preferred implementation of an absorption filter 900 operating on a quad transmission line, the absorption filter 900 being constructed and operative in accordance with a preferred embodiment of the present invention. The absorption filter 900 is also intended to reduce DM insertion loss as well as to provide CM rejection.

The term "quad transmission line" is used throughout the present specification and claims to include a transmission line having a series of four separately insulated conductors, generally twisted together.

In FIG. 12, conductive wires 910, 920, 930 and 940 constitute a quad transmission line configuration in which wires 910 and 920 are at the same positive signal potential, and wires 930 and 940 are at the same negative signal potential. Such a quad configuration may be achieved by making electrical contact connections between wires 910 and 920, and between wires 930 and 940 at both input and output sides of the absorption filter 900. There may be additional contacts between the wires 910 and 920 at other locations along the absorption filter 900. Similarly, there may be additional contacts between the wires 930 and 940 at other locations along the absorption filter 900. As in the absorption filter 800 of FIG. 11, the quad transmission line is surrounded by at least one layer of low-loss dielectric composite absorbing material 950, covered by a conductive layer 960. The conductive layer 960 is preferably conductively connected to a local ground (not shown) at least at one location (not shown). Conductive connection of the conductive layer 960 is preferably obtained via an electrical connection. The electrical connection preferably includes at least one of the following connections: a direct connection; a connection via a capacitor; and a connection via low-impedance circuitry.

The local ground preferably includes at least one of the following: a local conductive chassis ground; a shield of host equipment; a housing of host equipment; a massive printed circuit ground plane; and a massive conductive plate (all not shown).

Preferably, all four wires 910, 920, 930 and 940 constituting the quad transmission line are twisted, which leads to a reduction of a magnetic field generated by differential current mode within the composite absorbing material 950 with respect to a magnetic field generated by currents in a twisted pair of wires. On the other hand, a magnetic field generated by CM currents remains, more or less, at the same level.

It is appreciated that the quad transmission line configuration may be replaced by a configuration comprising a plurality of pairs of conductors, which plurality of pairs of conductors include more than two pairs of conductors. The plurality of pairs of conductors is preferably arranged in an arrangement in which an electromagnetic (EM) field generated by a DM functional signal within a volume occupied by the least one layer 950 is below an EM field threshold level. The EM field threshold level may, for example, correspond to a 2–3 dB DM signal attenuation.

For example, the configuration comprising a plurality of pairs of conductors may include a 2×N (N is an integer greater than two) arrangement in which first N wires include a path for direct current of a DM signal, and second N wires include a path for return current of the DM signal. In the 2×N arrangement "positive" and "negative" wires are interleaved in a way that provides minimum EM field outside a volume occupied by the 2×N arrangement of wires. For example, the 2×N wires may be located at equal spaces from each other along a periphery of some low-loss round dielectric core, and each "positive" wire may be surrounded by two "negative" wires, and vice versa.

Figure 13:
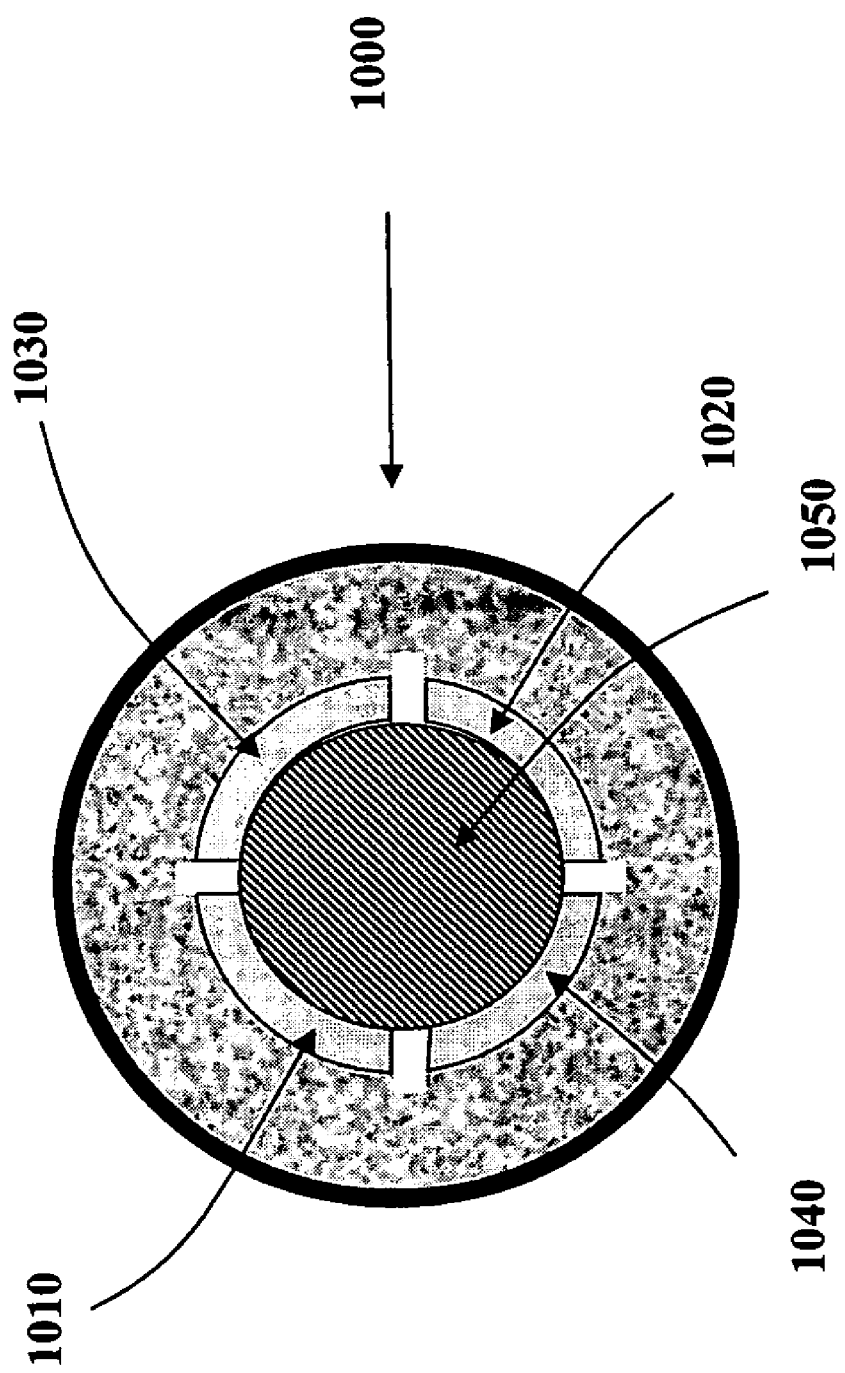
FIG. 13 is a simplified pictorial illustration of another preferred implementation of an absorption filter operating on a quad transmission line, the absorption filter being constructed and operative in accordance with a preferred embodiment of the present invention.

Reference is now made to FIG. 13, which is a simplified pictorial illustration of another preferred implementation of an absorption filter 1000 operating on a quad transmission line, the absorption filter 1000 being constructed and operative in accordance with a preferred embodiment of the present invention. The absorption filter 1000 is also intended to reduce DM insertion loss as well as to provide CM rejection.

The absorption filter 1000 is similar in structure and functionality to the absorption filter 900 of FIG. 12 except for quad transmission line structure. In FIG. 13, conductive wires 1010, 1020, 1030 and 1040 constitute a quad transmission line configuration in which wires 1010 and 1020 are at the same positive signal potential, and wires 1030 and 1040 are at the same negative signal potential. Each of the wires 1010, 1020, 1030 and 1040 may be coated by an optional isolation layer. All the wires 1010, 1020, 1030 and 1040 are arranged over a surface of a dielectric cylinder core 1050 in a spiral (twisted) way.. Due to quad configuration, an electromagnetic field generated by DM functional signal is primarily concentrated inside the dielectric cylinder core 1050. Field confinement within the dielectric cylinder core 1050 is better than in a twisted pair configuration thus resulting in lower DM insertion loss.

Each of the absorption filters 800 of FIG. 11, 900 of FIG. 12, and 1000 of FIG. 13 provides a relatively low attenuation to DM functional signals, and much greater attenuation to CM interference signals. For better confinement of a field generated by CM currents, an outer side of the corresponding layers of composite absorbing material is coated by at least one conductive layer. For even better attenuation, both sides of the at least one conductive layer are low-inductively connected or bonded to a local ground, where the local ground preferably includes at least one of the following: a local conductive chassis ground; a shield of host equipment; a housing of host equipment; a massive printed circuit ground plane; and a massive conductive plate (all not shown).

In each of the absorption filters 600 of FIG. 7, 700 and 710 of FIG. 10, 800 of FIG. 11, 900 of FIG. 12, and 1000 of FIG. 13 the corresponding composite absorbing material preferably includes a composite of magnetic powder immersed in a non-conductive dielectric binding material. The magnetic powder may include, for example, a mixture of magnetic metal powder and ferrite powder. The magnetic powder may include an amorphous metal alloy composed of Cobalt (Co), Iron (Fe), Nickel (Ni) and other elements. The dielectric binding material may include, for example, a composition of plastic, or lacquer, or any other appropriate compound material. The dielectric binding material may be loaded by (mixed with) a dielectric powder having a high dielectric constant, such as Barium Titanate.

It is appreciated that CM attenuation of each of the absorption filters 600 of FIG. 7, 700 and 710 of FIG. 10, 800 of FIG. 11, 900 of FIG. 12, and 1000 of FIG. 13 strongly depends upon a length of interaction between current-carrying conductors and the corresponding composite absorbing material. Different attenuation may thus be achieved by varying absorption filters lengths. Preferably, a length of each of the absorption filters 600, 700, 710, 800, 900 and 1000 is considerably greater than a corresponding diameter of the absorption filters 600, 700, 710, 800, 900 and 1000. For electronic packaging purposes, longwise filter structures may be curled, coiled in one or more layers, made in a zigzag form, or packaged in any other appropriate way and installed, as necessary, on a substrate for convenient placement on a printed circuit board (PCB), or inside an EIM, such as the EIM 200 of FIG. 2.

Figure 14:
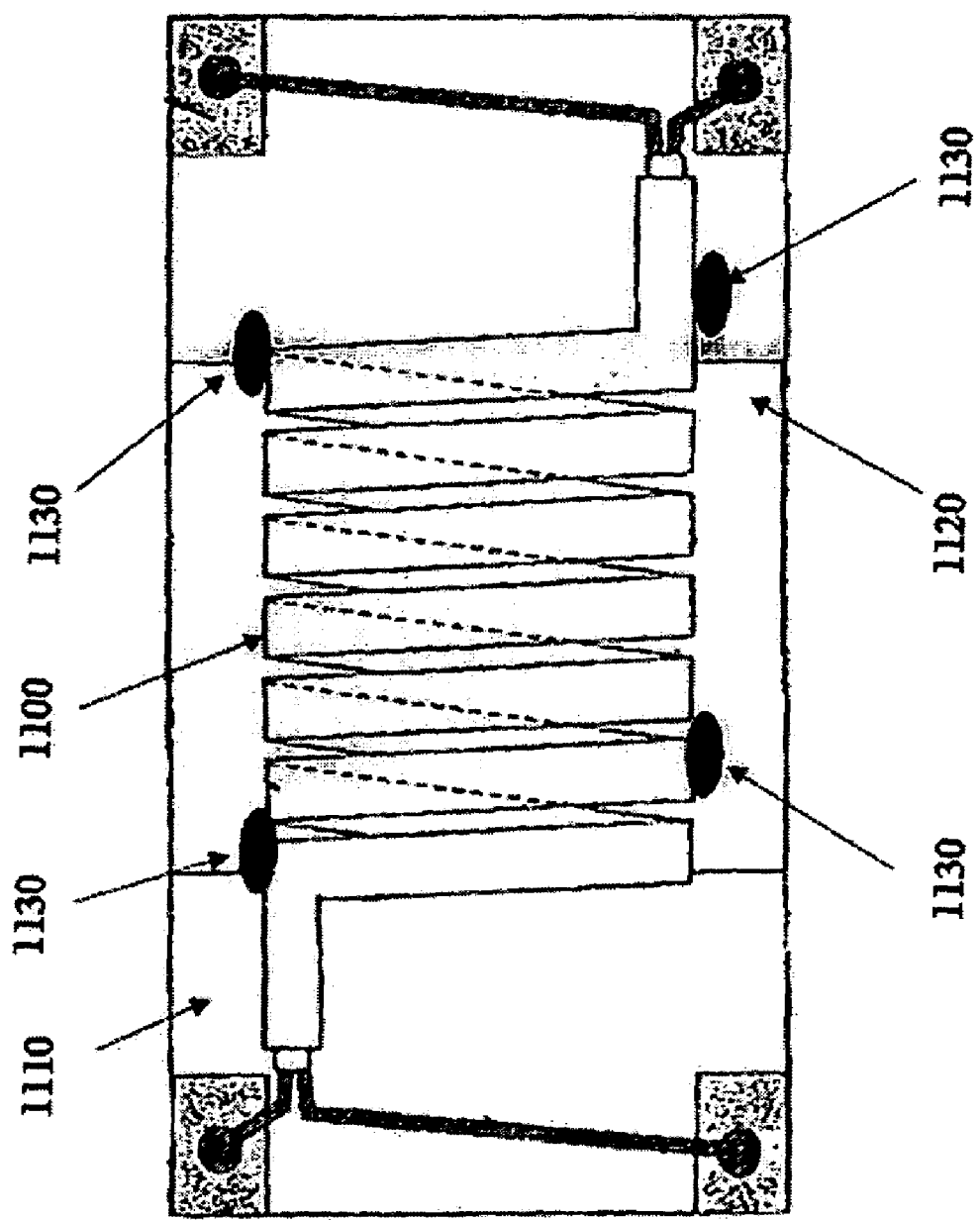
FIG. 14 is a simplified pictorial illustration of an absorption filter having a coil shape, the absorption filter being constructed and operative in accordance with a preferred embodiment of the present invention.

Reference is now made to FIG. 14, which is a simplified pictorial illustration of an absorption filter 1100 having a coil shape, the absorption filter 1100 being constructed and operative in accordance with a preferred embodiment of the present invention.

The absorption filter 1100 preferably includes one of the absorption filters 600, 700, 710, 800, 900, and 1000. The absorption filter 1100 is preferably placed on a substrate 1110. Preferably, a ground plane 1120 on the upper side of the substrate 1110 is, on one side, in low-inductance conductive contact 1130 with a conductive coating of the absorption filter 1100, and on the other side, in a low-inductance conductive contact with a ground electrode on the bottom of the substrate 1110 (not shown). Such a low-inductance contact may be obtained by means of through holes and/or metallic coating of side walls of the substrate 1110.

Figure 15:
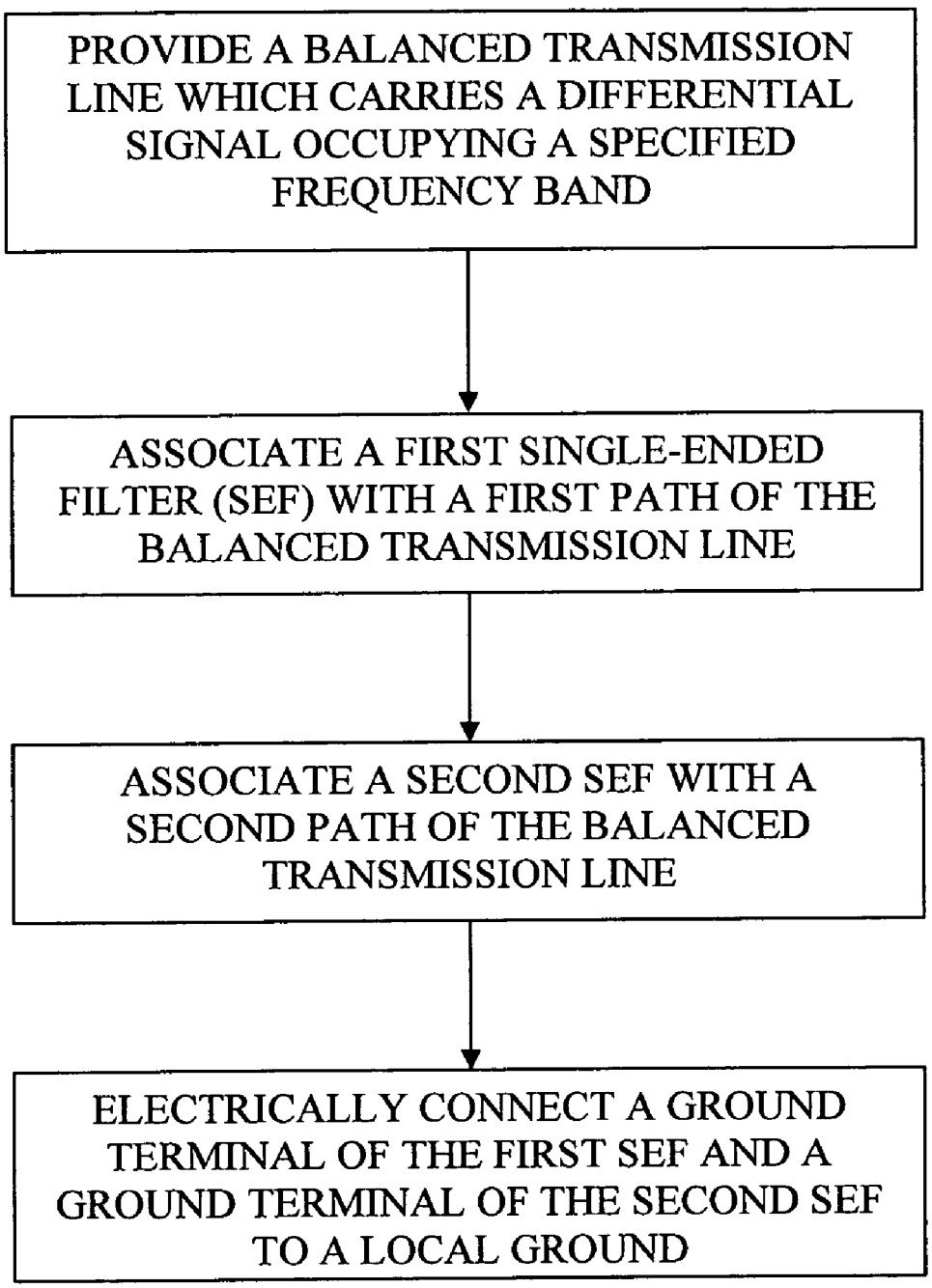
FIG. 15 is a simplified flowchart illustration of a preferred method of operation of the apparatus of FIG. 4.

Reference is now made to FIG. 15, which is a simplified flowchart illustration of a preferred method of operation of the apparatus 210 of FIG. 4. The method of FIG. 15 is self-explanatory.

Figure 16:
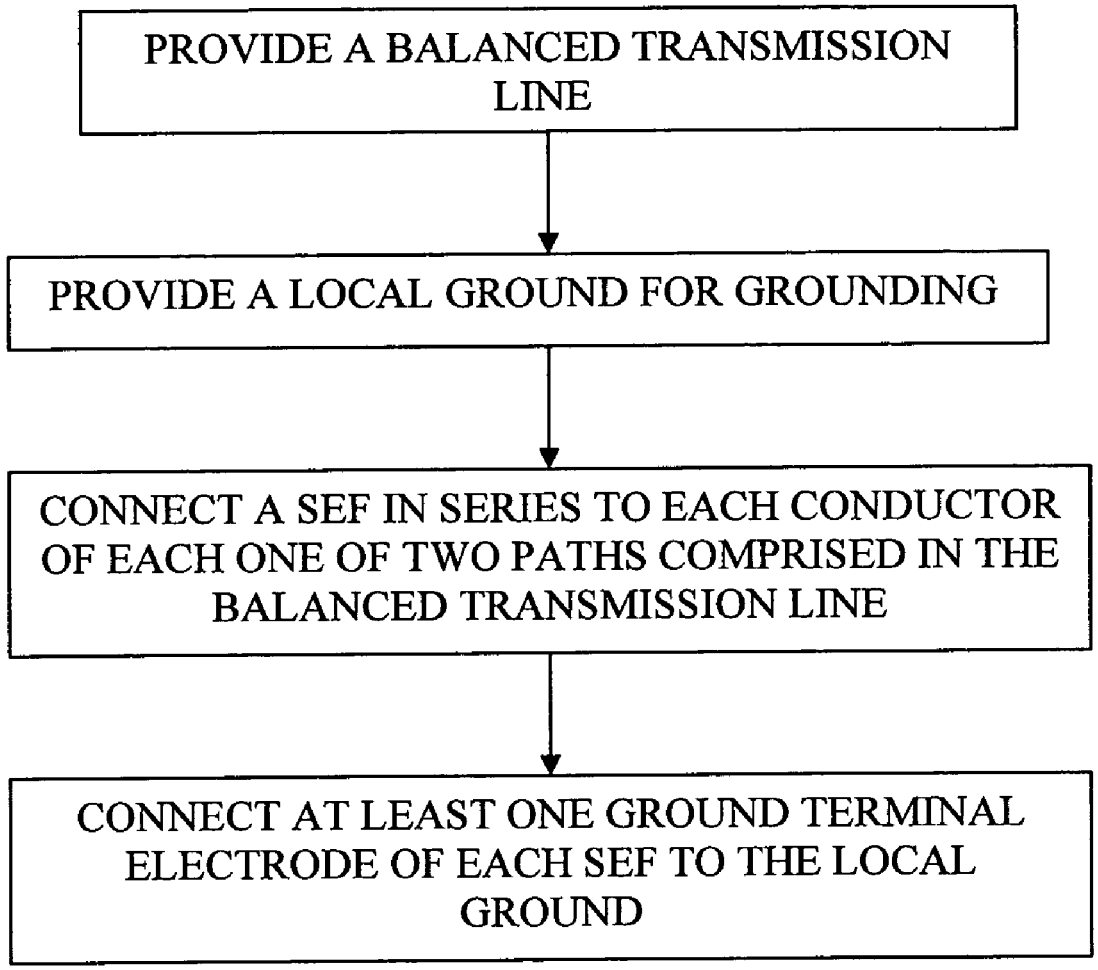
FIG. 16 is a simplified flowchart illustration of another preferred method of operation of the apparatus of FIG. 4.

Reference is now made to FIG. 16, which is a simplified flowchart illustration of another preferred method of operation of the apparatus 210 of FIG. 4. The method of FIG. 16 is self-explanatory.

Figure 17:
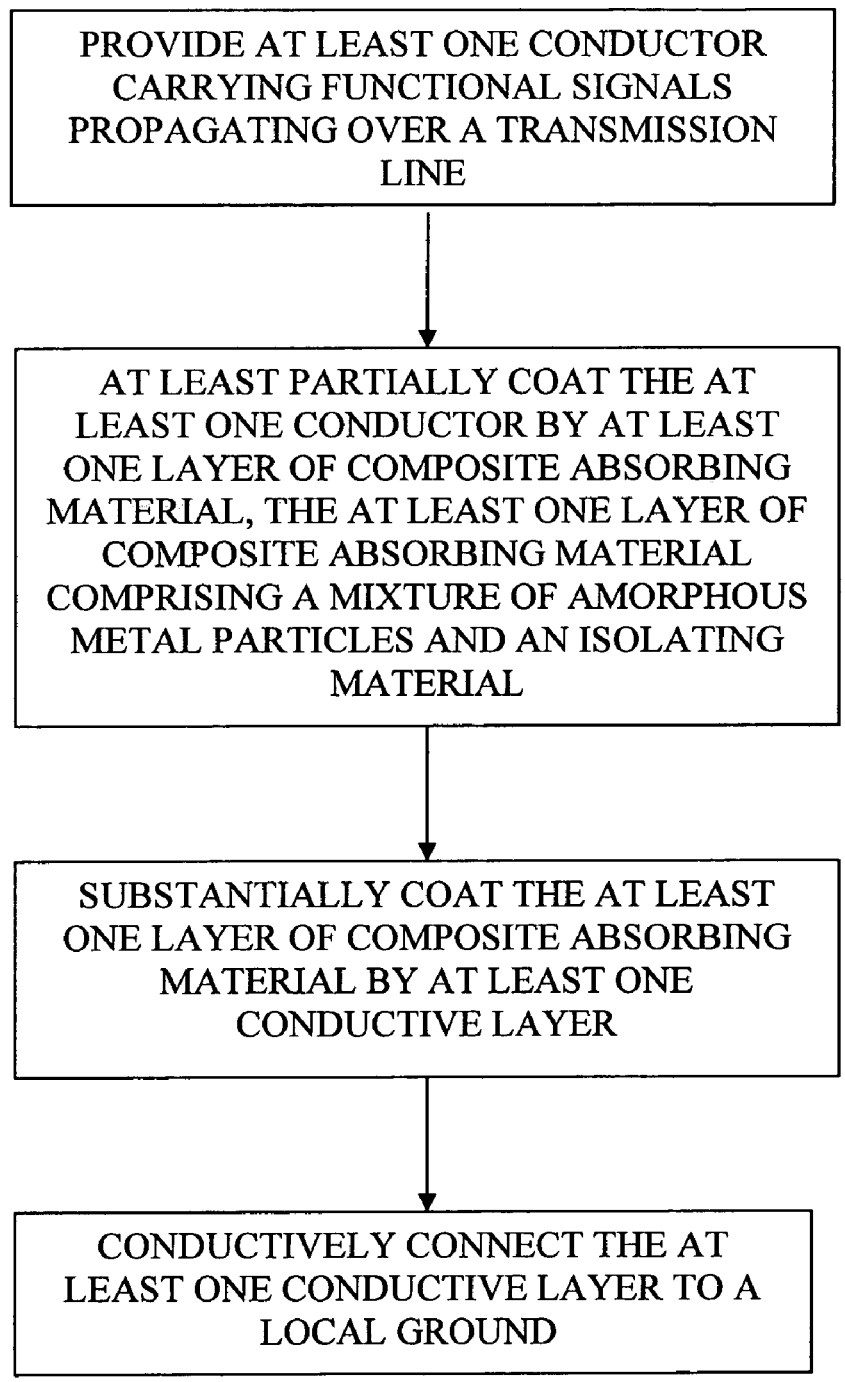
FIG. 17 is a simplified flowchart illustration of a preferred method of operation of the absorption filter of FIG. 7.

Reference is now made to FIG. 17, which is a simplified flowchart illustration of a preferred method of operation of the absorption filter 600 of FIG. 7. The method of FIG. 17 is self-explanatory.

Reference is now made to FIG. 18, which is a simplified flowchart illustration of a preferred method of operation of any of the absorption filter 900 of FIG. 12 and the absorption filter 1000 of FIG. 13. The method of FIG. 18 is self-explanatory.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable sub-combination.

It will be appreciated by persons skilled in the art that the present invention is not limited by what has been particularly shown and described hereinabove. Rather the scope of the invention is defined by the claims that follow:

What is claimed is:

1. An absorption filter for reducing electromagnetic interference (EMI) in a transmission line, the absorption filter comprising:
   at least one conductor carrying functional signals propagating over the transmission line;
   at least one layer of composite absorbing material at least partially coating the at least one conductor, the at least one layer of composite absorbing material comprising a mixture of amorphous metal particles and an isolating material in which the amorphous metal particles are immersed in the isolating material; and
   at least one conductive layer substantially coating the at least one layer of composite absorbing material, wherein the at least one conductive layer is conductively connected to a local ground.

2. The absorption filter according to claim 1 and wherein the transmission line comprises one of the following: at least one single-ended transmission line; and at least one balanced transmission line.

3. The absorption filter according to claim 1 and wherein the isolating material comprises a dielectric material having at least one of the following properties: a dielectric loss tan(δ) greater than 0.01; and a dielectric constant greater than ten.

4. The absorption filter according to claim 1 and wherein the isolating material comprises Barium Titanate.

5. The absorption filter according to claim 1 and wherein the local ground comprises at least one of the following: a local conductive chassis ground; a shield of host equipment; a housing of host equipment; a massive printed circuit ground plane; and a massive conductive plate.

6. The absorption filter according to claim 1 and wherein the at least one conductor comprises at least one of the following: a metallic conductor; a conductive adhesive; a conductive paint; a conductive plastic material; and a resin loaded with a conductive material.

7. The absorption filter according to claim 1 and wherein the at least one conductor comprises a plurality of pairs of conductors arranged in an arrangement in which an electromagnetic (EM) field generated by a differential-mode (DM) functional signal, within a volume occupied by the at least one layer of composite absorbing material, is below an EM field which corresponds to a 3 dB attenuation of the DM functional signal propagating through the filter.

8. The absorption filter according to claim 1 and wherein the at least one conductor comprises two pairs of conductors arranged in a quad configuration.

9. The absorption filter according to claim 1 and wherein the at least one conductor comprises at least one of the following: a pair of twisted wires; a multiple of pairs of twisted wires; and a multiple of two pairs of twisted wires.

10. A data link interface module comprising at least one of the absorption filter of claim 1.

11. A method for reducing electromagnetic interference (EMI) in a transmission line, the method comprising:
    providing at least one conductor carrying functional signals propagating over the transmission line;
    at least partially coating the at least one conductor by at least one layer of composite absorbing material, the at least one layer of composite absorbing material comprising a mixture of amorphous metal particles and an isolating material in which the amorphous metal particles are immersed in the isolating material;
    substantially coating the at least one layer of composite absorbing material by at least one conductive layer; and
    conductively connecting the at least one conductive layer to a local ground.

12. The absorption filter according to claim 1 and also comprising:
    at least one layer of dielectric material at least partially surrounding the at least one conductor.

13. The absorption filter according to claim 12 and wherein the dielectric material comprises a low-loss dielectric material.

14. The absorption filter according to claim 1 and wherein the at least one conductor comprises a pair of conductors, and the absorption filter comprises:
    at least one layer of dielectric material at least partially surrounding each conductor in the pair of conductors.

15. The method according to claim 11 and also comprising:
    at least partially surrounding the at least one conductor by at least one layer of dielectric material.

* * * * *